US008592812B2

(12) United States Patent
Tokashiki

(10) Patent No.: US 8,592,812 B2
(45) Date of Patent: Nov. 26, 2013

(54) DEVICE FOR ANALYZING CHARGE AND ULTRAVIOLET (UV) LIGHT

(75) Inventor: Ken Tokashiki, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 429 days.

(21) Appl. No.: 12/818,569

(22) Filed: Jun. 18, 2010

(65) Prior Publication Data

US 2011/0101348 A1    May 5, 2011

(30) Foreign Application Priority Data

Oct. 29, 2009    (KR) .................. 10-2009-0103769

(51) Int. Cl.
*H01L 27/06* (2006.01)

(52) U.S. Cl.
USPC ............... 257/48; 257/290; 257/E27.016

(58) Field of Classification Search
USPC .................... 257/48, 290, E27.016
See application file for complete search history.

(56) References Cited

U.S. PATENT DOCUMENTS 6,100,560 A * 8/2000 Lovett .......................... 257/315
6,586,765 B2   7/2003 Lin et al.
7,700,994 B2 * 4/2010 Roizin et al. ................. 257/315
7,903,465 B2 * 3/2011 Haggag et al. ............ 365/185.18
2010/0157669 A1 * 6/2010 Audzeyeu et al. ......... 365/185.1

FOREIGN PATENT DOCUMENTS

JP    2000-150606    5/2000
KR   1020060075783   7/2006

* cited by examiner

*Primary Examiner* — Matthew Landau
*Assistant Examiner* — Edward Chin
(74) *Attorney, Agent, or Firm* — F. Chau & Associates, LLC

(57) ABSTRACT

Provided is a device for analyzing at least one of a generated amount of positive charges, a generated amount of negative charges, and a generated amount of ultraviolet (UV) light. The device includes a substrate on which at least one of a first device configured to detect a variation in threshold voltage relative to the generated amount of positive charges, a second device configured to detect a variation in threshold voltage relative to the generated amount of negative charges, and a third device configured to detect a variation in threshold voltage relative to the generated amount of UV light is formed. Each of the first through third devices includes a first isolation region disposed in the substrate which define first and third active regions each of a first conductivity type and second and fourth active regions each of a second conductivity type different from the first conductivity type, first impurity regions disposed in the first active region and spaced apart from each other and having the second conductivity type, a floating gate crossing over the first active region between the first impurity regions and extending over the second active region, a second impurity region disposed in the second active region and having the first conductivity type, and a conductive structure electrically connected to the second impurity region.

17 Claims, 31 Drawing Sheets

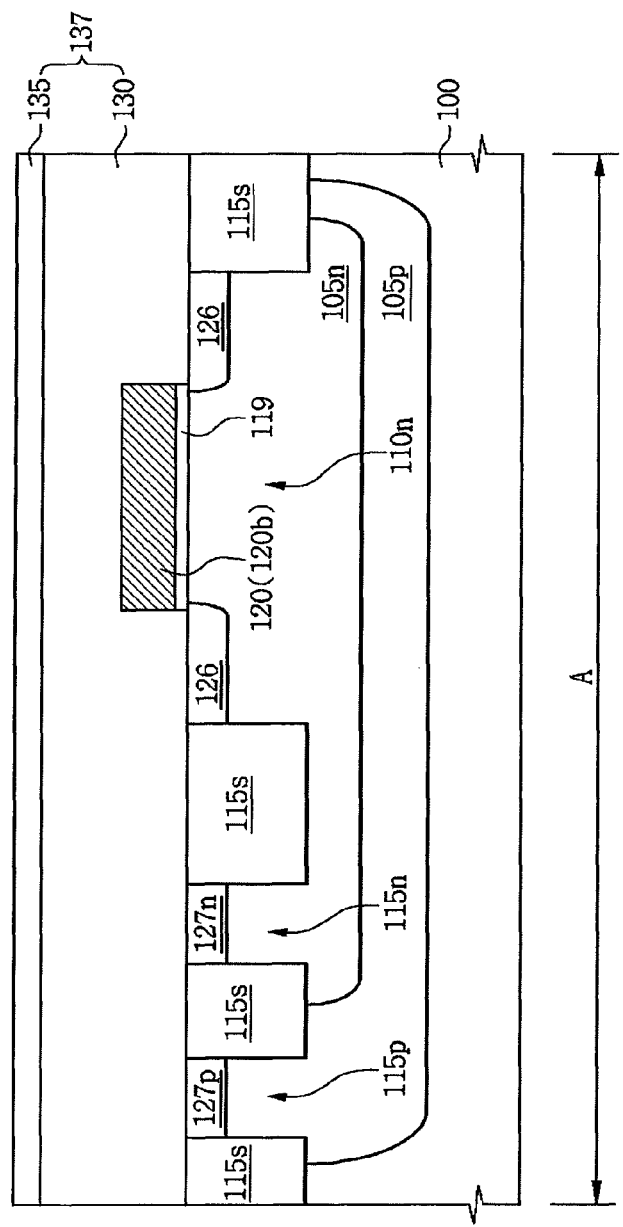

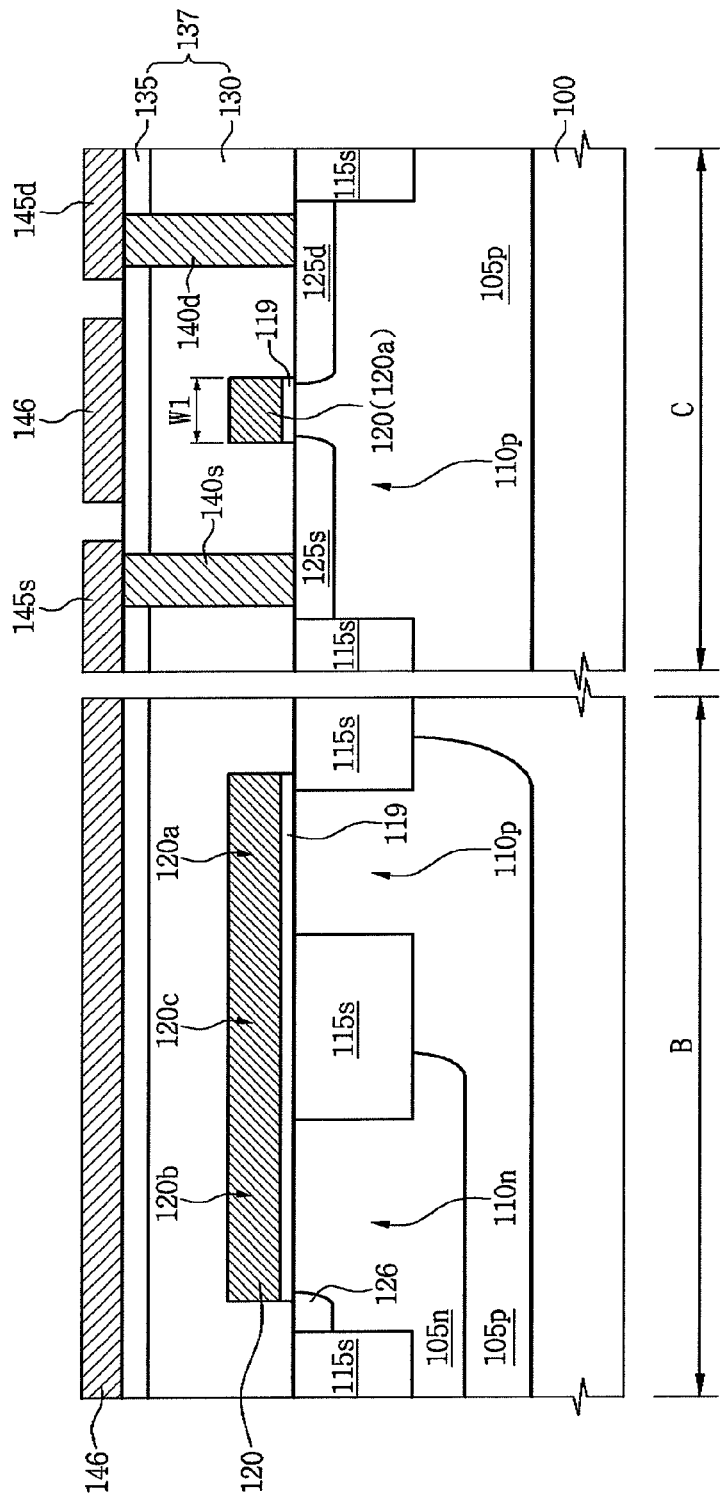

DEVICE FOR ANALYZING CHARGE AND ULTRAVIOLET (UV) LIGHT

CROSS-REFERENCE TO RELATED APPLICATION

This application claims priority to Korean Patent Application No. 10-2009-0103769, filed Oct. 29, 2009, the disclosure of which is hereby incorporated by reference herein in it's entirety.

BACKGROUND

1. Technical Field

Example embodiments relate to a device for charge and ultraviolet (UV) analysis, and more particularly, to a device for analyzing at least one of a generated amount of positive charges, a generated amount of negative charges, and a generated amount of UV light.

2. Description of Related Art

To improve the integration density and performance of semiconductor devices, advanced semiconductor process technology may be required. As a semiconductor process may be significantly affected by minute variations associated with process conditions, it may be necessary to analyze and monitor the minute variations associated with the process conditions.

Thus, there is a need in the art for a device for analyzing and monitoring the minute variations associated with semiconductor process conditions which is relatively simple to configure and cost effective to manufacture.

SUMMARY

Example embodiments may provide a device for analyzing and monitoring the minute variations associated with semiconductor process conditions which is relatively simple to configure and cost effective to manufacture.

Example embodiments may provide a device for analyzing at least one of a generated amount of positive charges, a generated amount of negative charges, and a generated amount of ultraviolet (UV) light.

According to example embodiments, a device for analyzing at least one of a generated amount of positive charges, a generated amount of negative charges, and a generated amount of UV light is provided. The device includes a substrate on which at least one of a first device configured to detect a variation in threshold voltage relative to the generated amount of positive charges, a second device configured to detect a variation in threshold voltage relative to the generated amount of negative charges, and a third device configured to detect a variation in threshold voltage relative to the generated amount of UV light is formed.

Each of the first through third devices includes a first isolation region disposed in the substrate. The first isolation region defines first and third active regions of a first conductivity type and second and fourth active regions of a second conductivity type different from the first conductivity type. First impurity regions are disposed in the first active region and spaced apart from each other. The first impurity regions have the second conductivity type. A floating gate crosses over the first active region between the first impurity regions and extends over the second active region. A second impurity region is disposed in the second active region and has the first conductivity type. A conductive structure is electrically connected to the second impurity region.

Each of the first through third devices may further include a third impurity region disposed in the third active region and having the first conductivity type. A fourth impurity region may be disposed in the fourth active region and having the second conductivity type. A source terminal may be electrically connected to one of the first impurity regions. A drain terminal electrically may be connected to the other of the first impurity regions. A well terminal may be electrically connected to the third impurity region. In the first through third devices, at least a portion of the conductive structure may be defined as a gate terminal.

Each of the first and third devices may further include a plug which electrically connects the conductive structure and the fourth impurity region.

The first device may accumulate positive charges, which are generated during a plasma process, through the second impurity region of the first device in the second active region and emit negative charges, which are generated during the plasma process, through the fourth impurity region and the fourth active region, to the substrate.

In the second device, the well terminal may be electrically connected not only to the third impurity region but also to the fourth impurity region.

The second device may emit positive charges, which are generated during a plasma process, through the second impurity region, the second and fourth active regions, the fourth impurity region, and the well terminal of the second device and accumulate negative charges, which are generated during the plasma process, through the second impurity region in the second active region.

In the third device, the conductive structure may have an opening exposing at least a portion of the floating gate.

The opening may have a smaller planar area than the floating gate.

The opening may overlap the floating gate.

In the first and second devices, a portion of the conductive structure may be defined as a gate terminal, and a portion of the remaining portion of the conductive structure may be defined as an antenna configured to introduce positive and negative charges into the first and second devices.

The electrical properties of the floating gate of the first device may be varied due to the accumulation of positive charges generated during a plasma process in the second active region. The electrical properties of the floating gate of the second device may be varied due to the accumulation of negative charges generated during the plasma process in the second active region. Also, the electrical properties of the floating gate of the third device may be varied by exciting electrons in the floating gate with UV light generated during the plasma process.

In the first through third devices, an overlap area between the second active region and the floating gate may be larger than an overlap area between the first active region and the floating gate.

The first and third active regions may be disposed in a first well region of the first conductivity type of the substrate, and the second and fourth active regions may be disposed in a second well region of the second conductivity type of the substrate.

In each of the first and second devices, at least a portion of the conductive structure may vertically overlap at least a portion of the floating gate.

The conductive structure of each of the first and second devices may cover the second active region.

According to other example embodiments, a device for analyzing a generated amount of UV light is provided. The device includes: a substrate having first and second regions; a first UV detection unit disposed in the first region of the substrate; and a second UV detection unit disposed in the second region of the substrate.

Each of the first and second UV detection units includes an isolation region disposed in the substrate, and configured to define first and third active regions of a first conductivity type and define second and fourth active regions of the first conductivity type. First impurity regions are disposed in the first active region and spaced apart from each other. The first impurity regions have a different conductivity type from the first active region. A floating gate crosses over the first active region between the first impurity regions and extends over the second active region. A second impurity region is disposed in the second active region and has a different conductivity type from the second active region. A third impurity region is disposed in the third active region and has the same conductivity type as the third active region. A fourth impurity region is disposed in the fourth active region and has the same conductivity type as the fourth active region. A well terminal is electrically connected to the third impurity region. A source terminal is electrically connected to one of the first impurity regions. A drain terminal is electrically connected to the other of the first impurity regions. A gate terminal is electrically connected to the second impurity region and has an opening exposing at least a portion of the floating gate.

The opening is formed to have a first planar area in the first UV detection unit and have a second planar area in the second UV detection unit, and the first planar area is different from the second planar area.

In each of the first and second devices, an overlap area between the second active region and the floating gate may be larger than an overlap area between the first active region and the floating gate.

According to still other example embodiments, a device for analyzing at least one of an amount of positive charges, an amount of negative charges, and an amount of UV light generated during a plasma process is provided. The device includes a substrate on which at least one of a first device configured to analyze the generated amount of positive charges, a second device configured to analyze the generated amount of negative charges, and a third device configured to analyze the generated amount of UV light is formed.

Each of the first through third devices includes a substrate having first and second active regions spaced apart from each other and having different conductivity types. A transistor includes source and drain regions and a first floating gate. The source and drain regions are disposed in the first active region and spaced apart from each other. The first floating gate is disposed on the first active region between the source and drain regions. A capacitive coupling gate (CCG) includes a second floating gate and an impurity region. The second floating gate is disposed on a portion of the second active region and electrically connected to the first floating gate. The impurity region is disposed in the second active region beside the second floating gate and has a different conductivity type from the source and drain regions.

Each of the first and second devices may include a conductive structure that is electrically connected to the impurity region and functions as an antenna exposed to the positive charges and the negative charges generated during the plasma process.

The third device may include a conductive structure that is electrically connected to the impurity region and wherein the conductive structure of the third device has an opening functioning as a window through which UV light generated during the plasma process is introduced into the second floating gate.

The first and second floating gates may be disposed at substantially the same horizontal level.

An overlap area between the second active region and the second floating gate may be larger than an overlap area between the first active region and the first floating gate.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EXAMPLE EMBODIMENTS

Figure 1:
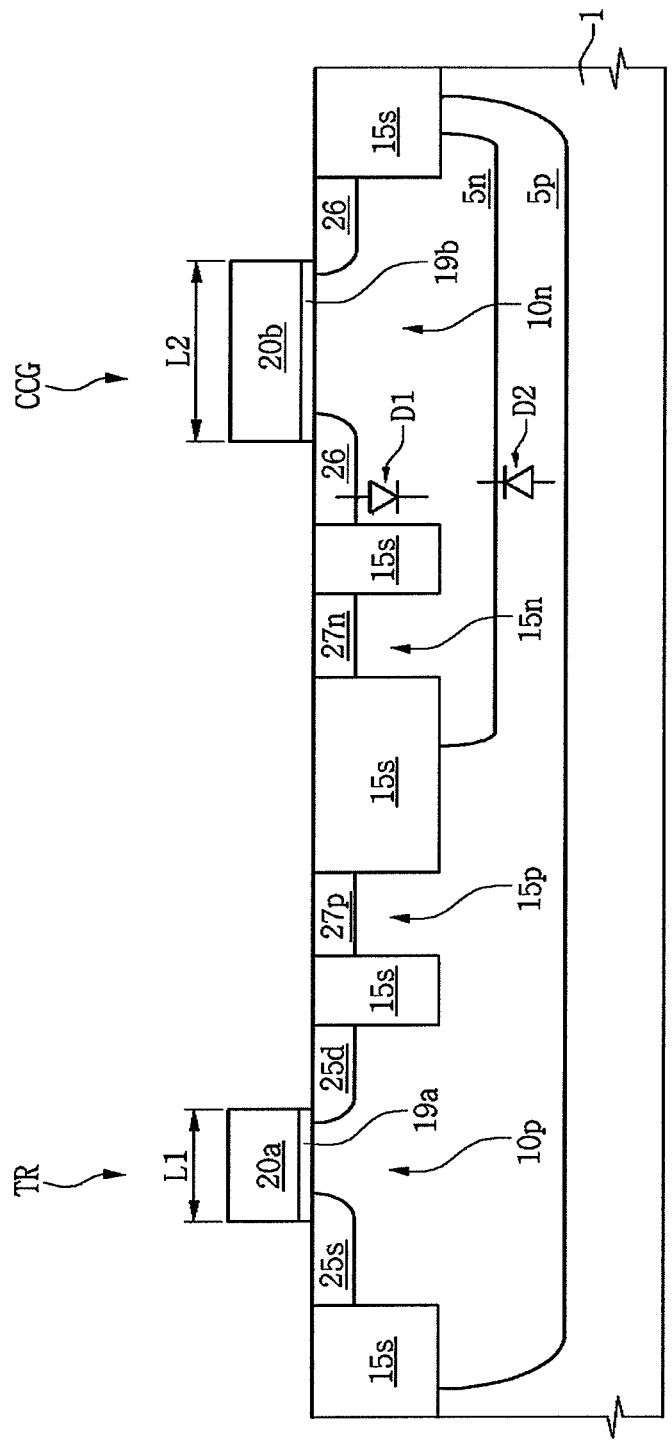
FIG. 1 is a cross-sectional view of a base body constituting a device according to an example embodiment.

Various example embodiments will now be described more fully with reference to the accompanying drawings in which some example embodiments are shown. This inventive concept may, however, be embodied in different forms and should not be construed as limited to the embodiments set forth herein. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

Figure 2:
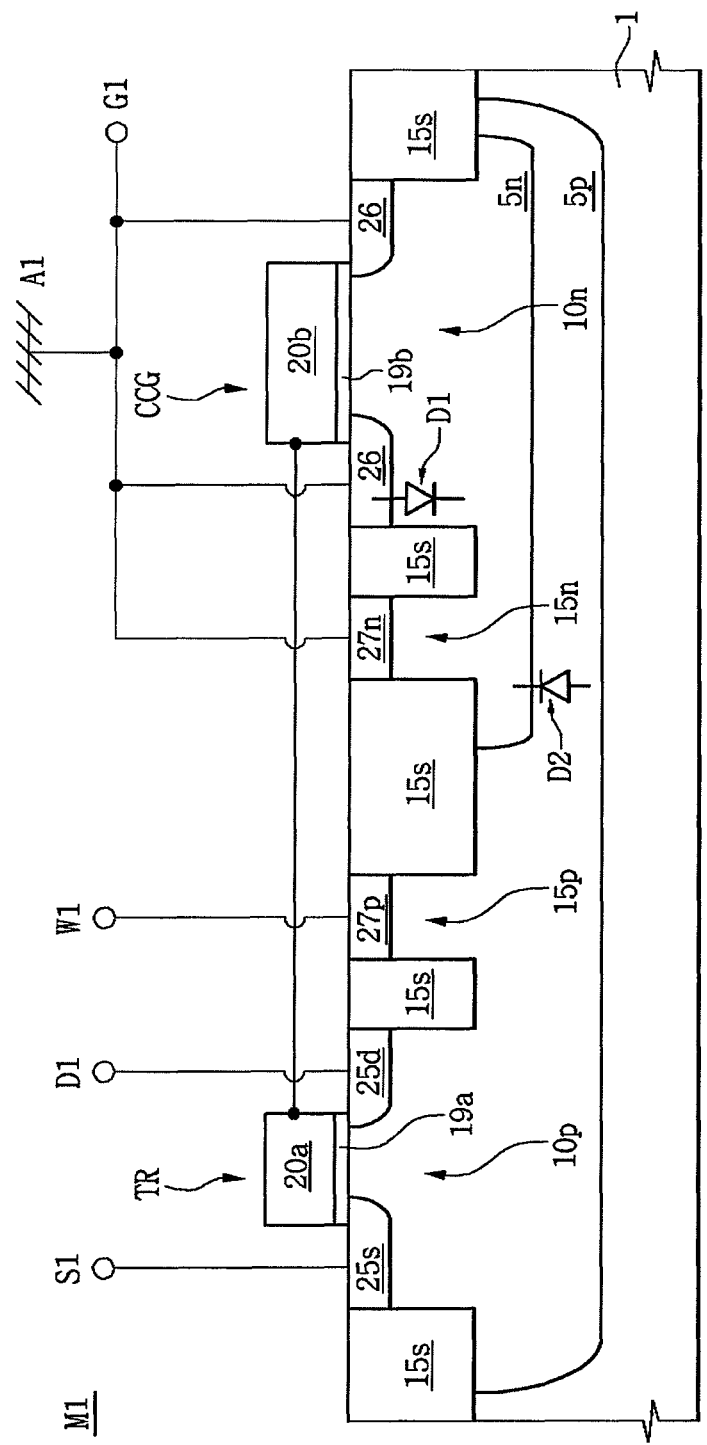
FIG. 2 is a schematic view of a device according to an example embodiment.
Figure 3:
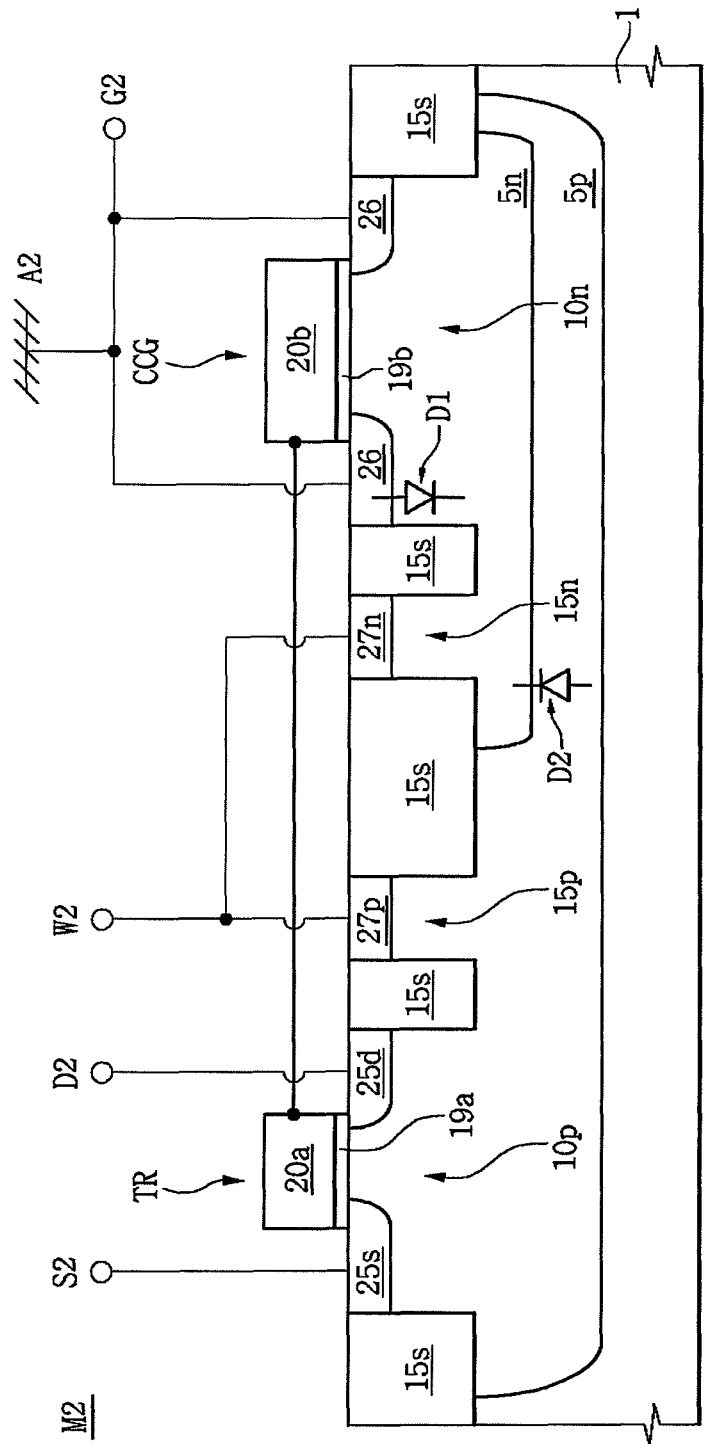
FIG. 3 is a schematic view of a device according to an example embodiment.
Figure 4:
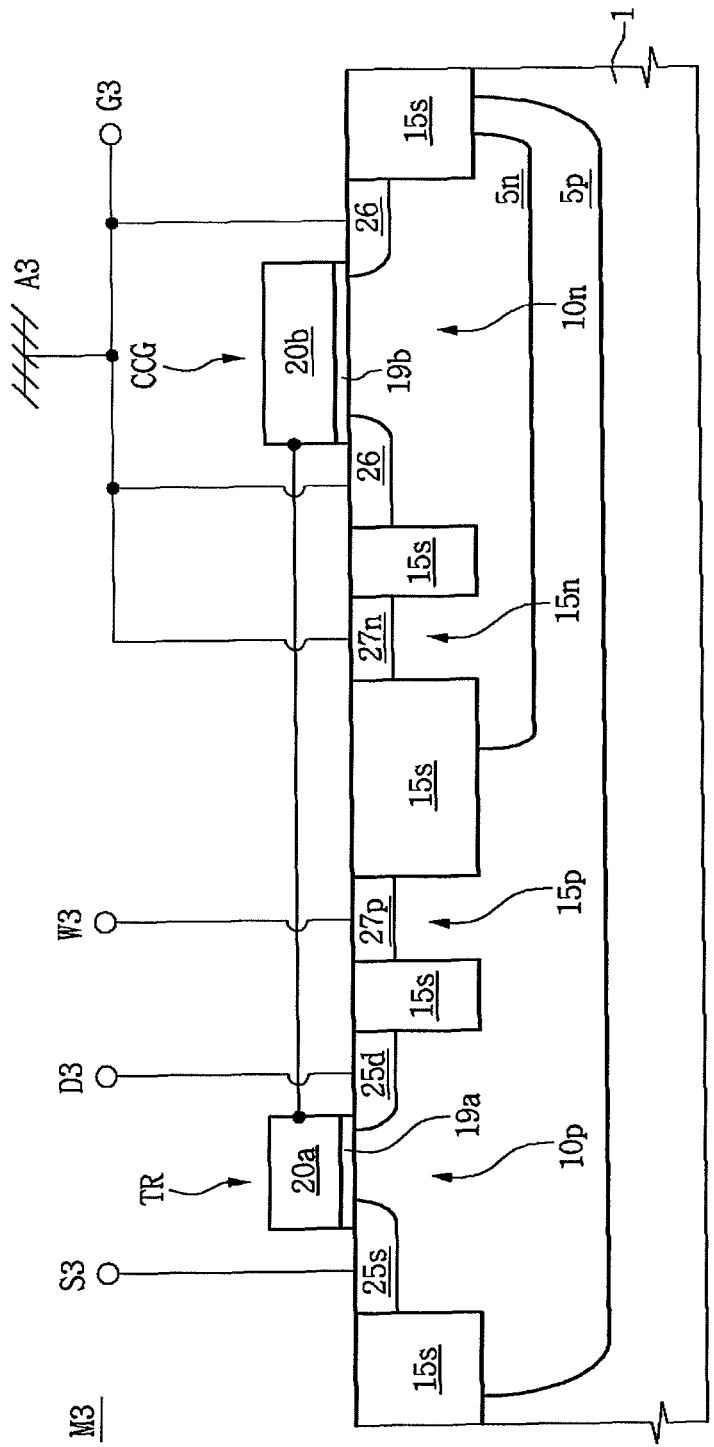
FIG. 4 is a schematic view of a device according to an example embodiment.

First, concepts of example embodiments will be described with reference to FIGS. 1 through 4. FIG. 1 is a cross-sectional view of a base body of a device according to example embodiments, FIG. 2 is a schematic view of a device according to example embodiments, FIG. 3 is a schematic view of a device according to other example embodiments, and FIG. 4 is a schematic view of a device according to still other example embodiments.

To begin, a base body of the device according to the example embodiments will be described with reference to FIG. 1.

Referring to FIG. 1, a substrate 1 may be provided. The substrate 1 may be a semiconductor wafer including a semiconductor material, such as, for example, silicon. A first well region 5p and a second well region 5n may be provided in the substrate 1. The first well region 5p may have a first conductivity type, while the second well region 5n may have a second conductivity type different from the first conductivity type. For example, when the first well region 5p is a p-type well region, the second well region 5n may be an n-type well region.

In some example embodiments, when the substrate 1 has the same conductivity type as the first well region 5p, the first well region 5p may be omitted, and the substrate 1 may function as the first well region 5p.

An isolation region 15s may be disposed to define a first active region 10p and a second active region 10n in the first well region 5p and the second well region 5n, respectively. Also, the isolation region 15s may define a third active region 15p and a fourth active region 15n in the first well region 5p and the second well region 5n, respectively. The isolation region 15s may be formed of, for example, a trench isolation layer.

The first active region 10p and the third active region 15p may be formed in the first well region 5p, while the second active region 10n and the fourth active region 15n may be formed in the second well region 5n. Accordingly, the first and third active regions 10p and 15p may have the same first conductivity type as the first well region 5p, while the second and fourth active regions 10n and 15n may have the same second conductivity type as the second well region 5n. Also, the first well region 5p may be disposed under the first and third active regions 10p and 15p and under the isolation region 15s interposed between the first and third active regions 10p and 15p.

The isolation region 15s may have a first bottom surface at a higher level than a bottom surface of the first well region 5p. Also, the isolation region 15s may have a second bottom surface at a higher level than a bottom surface of the second well region 5n.

A first floating gate 20a may cross over the first active region 10p, and a second floating gate 20b may be disposed on a portion of the second active region 10n. The first and second floating gates 20a and 20b may be formed of the same material. For example, the first and second floating gates 20a and 20b may be formed of a conductive material, such as doped silicon. In the present embodiments, a material forming the first and second floating gates 20a and 20b is not limited to doped silicon. For example, the first and second floating gates 20a and 20b may be formed of at least one selected from the group consisting of doped polysilicon (poly-Si), a metal, and a metal-nitride. The second floating gate 20b may have a width L2 greater than a width L1 of the first floating gate 20a.

A first dielectric material 19a may be disposed between the first floating gate 20a and the first active region 10p. A second dielectric material 19b may be disposed between the second floating gate 20b and the second active region 10n. The first and second dielectric materials 19a and 19b may be formed of, for example, a silicon oxide layer and/or a high-k dielectric layer. Here, the high-k dielectric layer may be defined as a dielectric material having a higher dielectric constant than the silicon oxide layer.

First impurity regions 25s and 25d may be disposed in the first active region 10p on both sides of the first floating gate 20a and spaced apart from each other. The first impurity regions 25s and 25d may have a different conductivity type from the first well region 5p. For example, when the first well region 5p is a p type, the first impurity regions 25s and 25d may be n types.

Second impurity regions 26 may be disposed in the second active region 10n on both sides of the second floating gate 20b. The second impurity regions 26 may have a different conductivity type from the second well region 5n. For example, when the second well region 5n is an n type, the second impurity regions 26 may be p types.

In some example embodiments, the second floating gate 20b may partially overlap the second impurity regions 26. A region of the second floating gate 20b which vertically overlaps the second impurity region 26 may be larger than the remaining region of the second floating gate 20b, which does not overlap the second impurity region 26.

The second impurity region 26 and the second well region 5n may constitute a first diode D1. Also, the first and second well regions 5p and 5n may constitute a second diode D2.

A third impurity region 27p may be disposed in the third active region 15p. The third impurity region 27p may be disposed in an upper region of the third active region 15p. The third impurity region 27p may have the same conductivity type as the first well region 5p and a higher dopant concentration than the first well region 5p.

A fourth impurity region 27n may be disposed in the fourth active region 15n. The fourth impurity region 27n may be disposed in an upper region of the fourth active region 15n. The fourth impurity region 27n may have the same conductivity type as the second well region 5n and a higher dopant concentration than the second well region 5n.

In some example embodiments, a transistor TR may include the first impurity regions 25s and 25d, which are disposed in the first active region 10p, and the first dielectric material 19a and the first floating gate 20a, which are sequentially stacked on the first active region 10p between the first impurity regions 25s and 25d. Also, a capacitive coupling gate (CCG) may include the second impurity region 26, which is disposed in the second active region 26, and the second dielectric material 19b and the second floating gate 20b, which are sequentially stacked on the second active region 10n.

According to a method of electrically connecting the components of the base body and a method of disposing the antenna, it may be determined which one of a generated amount of positive charges, a generated amount of negative charges, and a generated amount of UV light is to be analyzed and/or monitored.

Hereinafter, example embodiments of the present inventive concept according to a method of electrically connecting the components of the base body and a method of disposing the antenna as described with reference to FIG. 1 will be described.

According to example embodiments of the present inventive concept, a device capable of analyzing and/or monitoring a generated amount of positive charges may be provided. For example, a device capable of analyzing and/or monitoring a generated amount of positive charges in a process of generating at least one of positive charges, negative charges, and UV light will now be described with reference to FIG. 2.

Here, for example, the process may be a semiconductor process using plasma, such as a deposition process or etch process.

Referring to FIG. 2, the first floating gate 20a and the second floating gate 20b may be electrically connected to each other. One 25s of the first impurity regions 25s and 25d may be electrically connected to a source terminal S1, while the other 25d thereof may be electrically connected to a drain terminal D1. The third impurity region 27p may be electrically connected to a well terminal W1. The second and fourth impurity regions 26 and 27n may be electrically connected to an antenna A1 and a gate terminal G1. Here, the antenna A1 and the gate terminal G1 may be electrically connected to each other.

Thus, a first device M1, which operates based on similar principles as an electrically erasable and programmable read only memory (EEPROM) and has a different structure from an EEPROM, may be provided. For example, in view of the fact that an EEPROM includes a gate structure having a tunnel oxide layer, a floating gate, a blocking oxide layer, and a control gate, which are stacked sequentially on a semiconductor substrate, and a source region and a drain region disposed in the semiconductor substrate on both sides of the gate structure, the second active region 10n disposed under the second floating gate 20b may function as a control gate of the EEPROM, the first and second floating gates 20a and 20b may be electrically connected to each other and function as a floating gate of the EEPROM, the second dielectric material 19b may function as a blocking oxide layer of the EEPROM, the first dielectric material 19a may function as a tunnel oxide layer of the EEPROM, and the first and second impurity regions 25s and 25d may function as source and drain regions of the EEPROM.

A method of analyzing and/or monitoring a generated amount of positive charges using the first device M1 of FIG. 2 will now be described with reference to FIG. 5.

Figure 5:
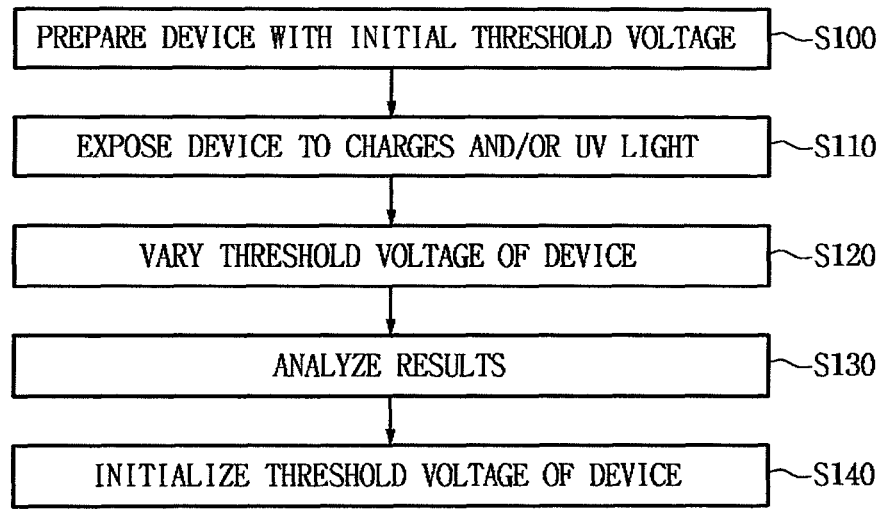
FIG. 5 is a flowchart illustrating a method of analyzing and/or monitoring charges and/or ultraviolet (UV) light using devices according to an example embodiment.

Referring to FIGS. 2 and 5, the first device M1 of FIG. 2 may be prepared (S100). The first device M1 may be an initialized device that is not exposed to charges and/or UV light. That is, the first device M1 may have an initial threshold voltage $V_{Ti}$.

The initialized first device M1 may be exposed to charges (S110). For example, the first device M1 may be exposed to positive charges and negative charges generated during a semiconductor process using plasma, such as a deposition process or etching process. As a result, the positive charges and negative charges generated in the semiconductor process using plasma may be supplied to the first device M1 through the antenna A1. Here, the positive charges may be accumulated in the second active region 10n through the first diode D1, while the negative charges may be emitted into the first well region 5p and/or the substrate 1 through the fourth impurity region 27n and the second diode D2. Thus, the positive charges may be accumulated in the second well region 5n of the second active region 10n so that the same effect can be obtained as when a gate voltage is applied to the second active region 10n. As a result, electrical properties of the first and second floating gates 20a and 20b, which are electrically connected to each other, may be changed. For instance, the positive charges may be accumulated in the second well region 5n of the second active region 10n so that F-N injection may occur between the first floating gate 20a and the first active region 10p. As a consequence, electrons may be trapped in the first floating gate 20a to shift the voltage level of the first and second floating gates 20a and 20b electrically connected to each other. As described above, the electrical properties of the first and second floating gates 20a and 20b may be changed so that a threshold voltage of the transistor of the first device M1 may be changed (S120).

Thereafter, results may be analyzed based on a variation $\Delta V_{Tp\text{-}p}$ in the threshold voltage of the transistor of the first device M1 (S130). Here, the variation $\Delta V_{Tp\text{-}p}$ in the threshold voltage may refer to a difference between the initial threshold voltage $V_{Ti}$ and a varied threshold voltage.

The variation $\Delta V_{Tp\text{-}p}$ in the threshold voltage of the transistor of the first device M1 may be determined by the amount of positive charges generated during a plasma process. That is, the amount of charges in the first and second floating gates 20a and 20b may be varied according to the amount of positive charges generated during the plasma process, and a threshold voltage of the first device M1 may be determined by, for example, a variation in the amount of charges in the first and second floating gates 20a and 20b. Accordingly, the threshold voltage of the initialized first device M1 measured before the first device M1 is exposed to the plasma process may differ from the threshold voltage of the first device M1 measured after the first device M1 is exposed to the plasma process. Accordingly, the threshold voltage of the first device M1 may be varied, for example, due to the positive charges generated during the plasma process. As a result, the amount of positive charges generated during the plasma process may be monitored, for example, based on the variation in threshold voltage of the first device M1.

According to example embodiments, the variation in threshold voltage $\Delta V_{Tp\text{-}p}$ of the transistor of the first device M1 may be utilized to estimate the reproducibility of the plasma process. When the variation $\Delta V_{Tp\text{-}p}$ in the threshold voltage of the transistor of the first device M1 due to the plasma process differs from a variation in threshold voltage due to an initial plasma process, it can be seen that the amount of positive charges generated during the plasma process may differ from the amount of positive charges generated during an initial plasma process.

According to example embodiments, the variation $\Delta V_{Tp\text{-}p}$ in the threshold voltage of the transistor of the first device M1 may be used to analyze defects in the plasma process. For example, when defects occur in the plasma process, the variation $\Delta V_{Tp\text{-}p}$ in the threshold voltage of the transistor of the first device M1 may be detected using the first device M1. Accordingly, when a variation in threshold voltage of the first device M1 due to a defective plasma process differs from a variation in threshold voltage of the first device M1 due to an optimum plasma process in which a variation in threshold voltage of the first device M1 is initialized, it can be seen that the amount of positive charges generated from plasma may cause difficulties. Conversely, when the variation in threshold voltage of the first device M1 due to the defective plasma process is the same as the variation in threshold voltage of the first device M1 due to the optimum plasma process in which the variation in threshold voltage of the first device M1 is initialized, it can be seen that the amount of positive charges generated from plasma may be free from difficulties.

The threshold voltage of the first device M1 whose threshold voltage is changed may be initialized (S140). For example, a positive voltage may be applied to the gate terminal G1, the source terminal S1, the drain terminal D1, and the well terminal W1 so that the trapped electrons may be erased from the first and second floating gates 20a and 20b to initialize the device M1. Alternatively, a positive voltage may be applied to the gate terminal G1, and the source terminal S1, the drain terminal D1, and the well terminal W1 may be grounded so that the trapped electrons may be erased from the first and second floating gates 20a and 20b to initialize the device M1.

Thus, after analyzing and/or monitoring the amount of positive charges generated in a semiconductor process, such as, for example, a plasma process, the initialized first device M1 may be initialized and reused.

Next, a device for analyzing and/or monitoring a generated amount of negative charges in a process of generating at least one of positive charges, negative charges, and UV light will be described with reference to FIG. 3.

Referring to FIG. 3, like the device of FIG. 2, which is capable of analyzing and/or monitoring a generated amount of positive charges, the first floating gate 20a and the second floating gate 20b may be electrically connected to each other. Also, one 25s of the first impurity regions 25s and 25d may be electrically connected to the source terminal S2, while the other 25d thereof may be electrically connected to the drain terminal D2.

The third impurity region 27p of the first well region 5p may be electrically connected to the fourth impurity region 27n of the second well region 5n. Also, the third and fourth impurity regions 27p and 27n may be electrically connected to the well terminal W2.

The second impurity region 26 may be electrically connected to the antenna A2 and the gate terminal G2. The antenna A2 may be electrically connected to the gate terminal G2. A second device M2, which operates based on similar principles to an EEPROM and has a different structure from an EEPROM, may be provided.

A method of analyzing and/or monitoring an amount of negative charges using the second device M2 of FIG. 3 will now be described with reference to FIG. 5.

Referring to FIGS. 3 and 5, the second device M2 of FIG. 3 may be prepared (S100). The second device M2 may be an initialized device that is not exposed to charges and/or UV light. That is, the second device M2 may have an initial threshold voltage $V_{Ti}$.

The initialized second device M2 may be exposed to positive charges and negative charges (S110). For example, the second device M2 may be exposed to charges generated during a plasma process. As a result, positive and negative charges generated during the plasma process may be introduced into the second device M2 through the antenna A2. Among the charges introduced in the second device M2, the positive charges may be introduced into the second well region 5n through the first diode D1, and the positive charges introduced in the second well region 5n may be emitted into the first well region 5p and the substrate 1 through the well terminal W2 that electrically connects the fourth impurity region 27n and the third impurity region 27p. Also, among the charges introduced in the second device M2, the negative charges may be accumulated in the second active region 10n. For example, the negative charges may not be introduced into the second well region 5n but accumulated in the second impurity region 26 of the second active region 10n due to the first diode D1.

Accordingly, the negative charges introduced into the second device M2 may not be emitted but accumulated in the second active region 10n, for example, the second impurity region 26, thereby changing the electrical properties of the first and second floating gates 20a and 20b. That is, positive charges (e.g., holes) may be trapped in the first floating gate 20a to change the electrical properties of the first and second floating gates 20a and 20b. Thus, the changes in the electrical properties of the first and second floating gates 20a and 20b may lead to a variation in threshold voltage of the transistor of the second device M2 (S120).

Thereafter, results may be analyzed based on a variation $\Delta V_{Tp\text{-}p}$ in a threshold voltage of the transistor of the second device M2 (S130). For example, the threshold voltage of the transistor of the second device M2 may be varied according to the amount of negative charges generated during a plasma process. That is, a variation in the amount of charges in the first and second floating gates 20a and 20b may be determined by, for example, the amount of negative charges generated during the plasma process, and a variation in threshold voltage of the second device M2 may be determined by, for example, the variation in the amount of charges in the first and second floating gates 20a and 20b. Thus, the amount of negative charges generated during the plasma process may be monitored, for example, based on the variation in threshold voltage of the second device M2 in the same way as when the amount of positive charges generated during the plasma process is monitored based on the variation in threshold voltage of the first device M1.

A threshold voltage of the second device M2 with a varied threshold voltage may be initialized (S140). For example, by applying a negative voltage to the gate terminal G2, the source terminal S2, the drain terminal D2, and the well terminal W2, electrons may be introduced into the first and second floating gates 20a and 20b to erase positive charges (e.g., holes) trapped in the first and second floating gates 20a and 20b.

Accordingly, after analyzing and/or monitoring the amount of negative charges generated during a semiconductor process, such as, for example, a plasma process, the second device M2 may be initialized and reused.

Next, a device for analyzing and/or monitoring the generated amount of UV light will be described with reference to FIG. 4.

Referring to FIG. 4, like the device of FIG. 2, which is capable of analyzing and/or monitoring a generated amount of positive charges, the first and second floating gates 20a and 20b may be electrically connected to each other. Also, one 25s of the first impurity regions 25s and 25d may be electrically connected to a source terminal S3, and the other 25d thereof may be electrically connected to a drain terminal D3. The third impurity region 27p may be electrically connected to a well terminal W3.

The second impurity region 26 may be electrically connected to a gate terminal G3. Furthermore, the gate terminal G3 may be electrically connected to the fourth impurity region 27n.

An antenna A3 may be electrically connected to the second floating gate 20b. The antenna A3 may not be in direct contact with the gate terminal G3. That is, the antenna A3 may not be electrically connected to the gate terminal G3.

A method of analyzing and/or monitoring a generated amount of UV light using the third device M3 of FIG. 4 will now be described with reference to FIG. 5.

Referring to FIGS. 4 and 5, the third device M3 of FIG. 4 may be prepared (S100). The third device M3 may be an initialized device that is not exposed to charges and/or UV light. That is, the third device M3 may have an initialized threshold voltage $V_{Ti}$.

The initialized third device M3 may be exposed to UV light (S110). For example, the third device M3 may be exposed to UV light generated during a plasma process. As a result, the UV light generated during the plasma process may be introduced into the third device M3 through the antenna A3.

In the present embodiment, the floating gates 20a and 20b, for example, the second floating gate 20b, may be defined as the antenna A3. UV light generated during a plasma process may arrive in the floating gates 20a and 20b and change the electrical properties of the floating gates 20a and 20b. For example, UV light may excite electrons accumulated in the first and second floating gates 20a and 20b and change the electrical properties of the first and second floating gates 20*a* and 20*b*. As a result, a threshold voltage of the transistor of the third device M3 may be varied (S120).

Thereafter, results may be analyzed based on a variation in threshold voltage of the transistor of the third device M3 (S130). For example, a variation in threshold voltage of the transistor of the third device M3 may be determined by the amount of UV light generated during a plasma process. That is, the electrical properties of the first and second floating gates 20*a* and 20*b* may be varied, for example, according to the amount of UV light generated during a plasma process, and a variation in threshold voltage of the third device M3 may be determined by, for example, changes in the characteristics of the first and second floating gates 20*a* and 20*b*. Accordingly, the amount of UV light generated during a plasma process may be monitored, for example, based on a variation in threshold voltage of the third device M3 in the same way as when the amount of positive charges generated during the plasma process is monitored based on the variation in threshold voltage of the first device M1.

A threshold voltage of the transistor of the third device M3 whose threshold voltage is varied may be initialized (S140). Thus, the third device M3 may be initialized and reused after analyzing and/or monitoring the amount of UV light generated during a semiconductor process, such as, for example, a plasma process.

Hereinafter, more specific embodiments will be described.

Initially, a method of forming a device for analyzing and/or monitoring a generated amount of positive charges according to example embodiments will now be described with reference to FIGS. 6 through 10B.

Figure 6:
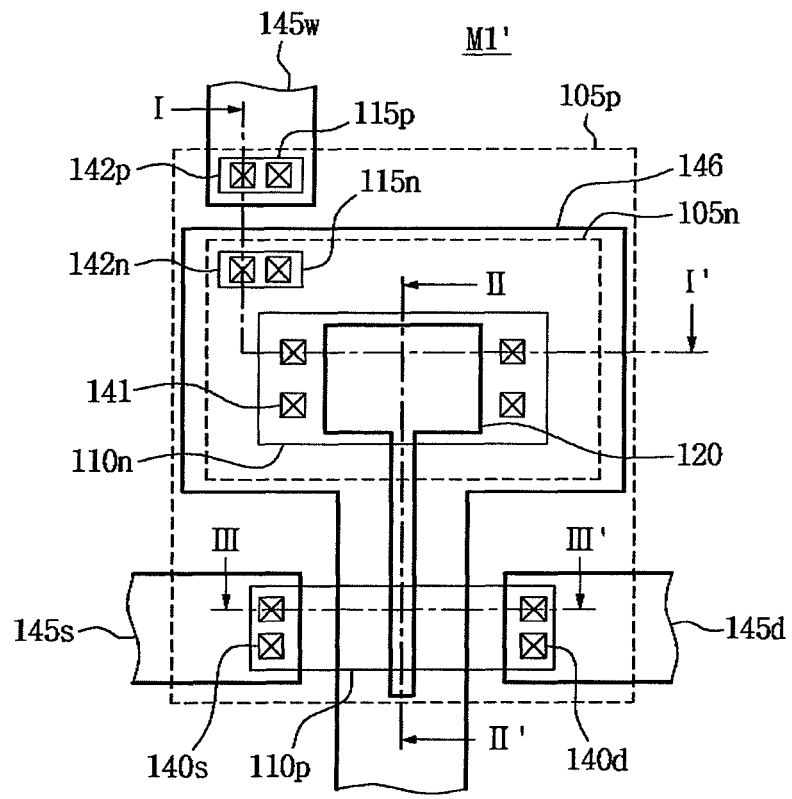
FIG. 6 is a plan view of a device according to an example embodiment.

FIG. 6 is a plan view of a device for analyzing and/or monitoring a generated amount of positive charges according to example embodiments, and FIGS. 7A through 10B are cross-sectional views of the device of FIG. 6. In FIGS. 7A through 10B, reference character "A" denotes a region taken along line I-I' of FIG. 6, "B" denotes a region taken along line II-II' of FIG. 6, and "C" denotes a region taken along line III-III' of FIG. 6.

Figure 7A:
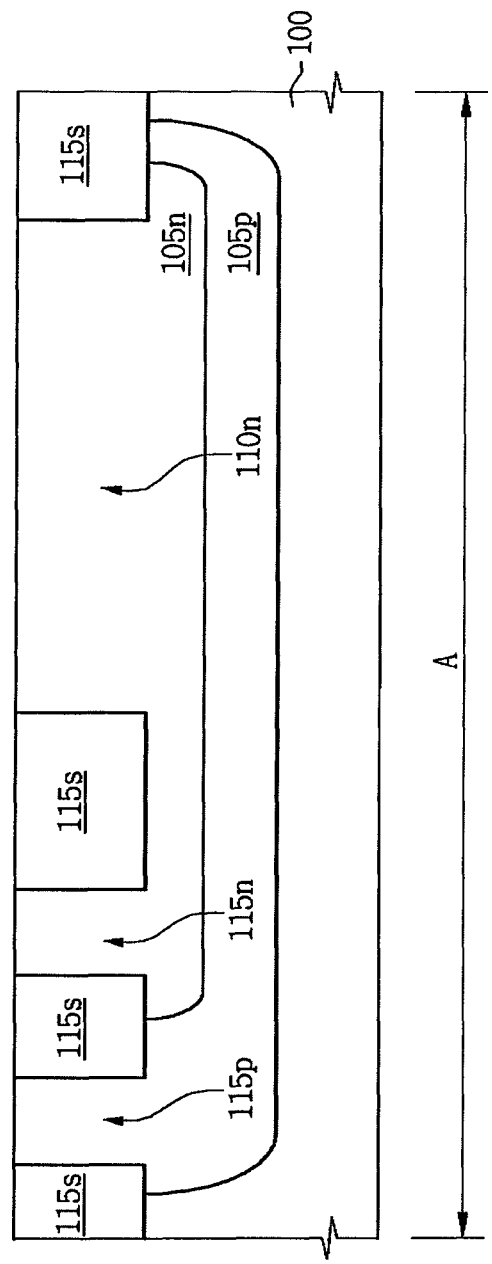
FIGS. 7A through 10B are cross-sectional views of the device of FIG. 6.
Figure 7B:
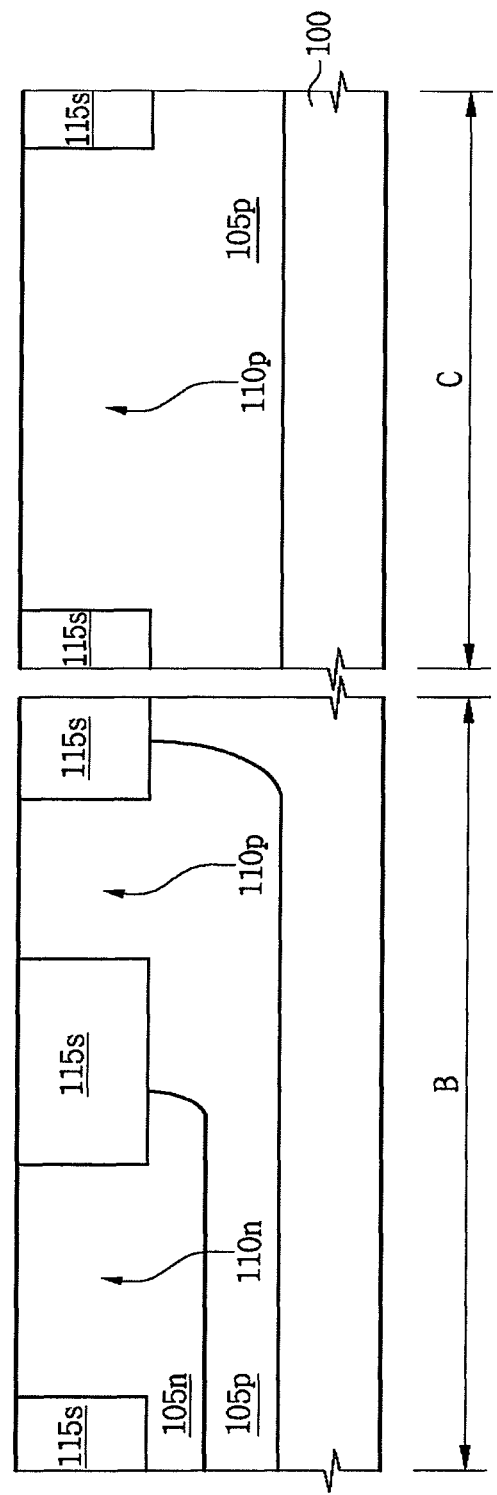

Referring to FIGS. 6, 7A, and 7B, a substrate 100 may be prepared. The substrate 100 may be a semiconductor wafer formed of a semiconductor material, such as, for example, silicon. A first well region 105*p* and a second well region 105*n* may be formed in a predetermined region of the substrate 100. The first and second well regions 105*p* and 105*n* may be formed using, for example, different well ion implantation processes. For example, the first well region 105*p* may be formed using a well ion implantation process for forming a p-type well region, while the second well region 105*n* may be formed using a well ion implantation process for forming an n-type well region.

An isolation region 115*s* defining first through fourth active regions 110*p*, 110*n*, 115*p*, and 115*n* may be formed in the substrate 100. Here, the first and third active regions 110*p* and 115*p* may be formed in the first well region 105*p*, and the second and fourth active regions 110*n* and 115*n* may be formed in the second well region 105*n*. From the plan view, the first active region 110*p* may have a smaller planar area than the second active region 110*n*.

According to some example embodiments, the isolation region 115*s* may be formed after forming the first and second well regions 105*p* and 105*n*. Alternatively, the isolation region 115*s* may be formed before forming the first and second well regions 105*p* and 105*n*.

Figure 8A:
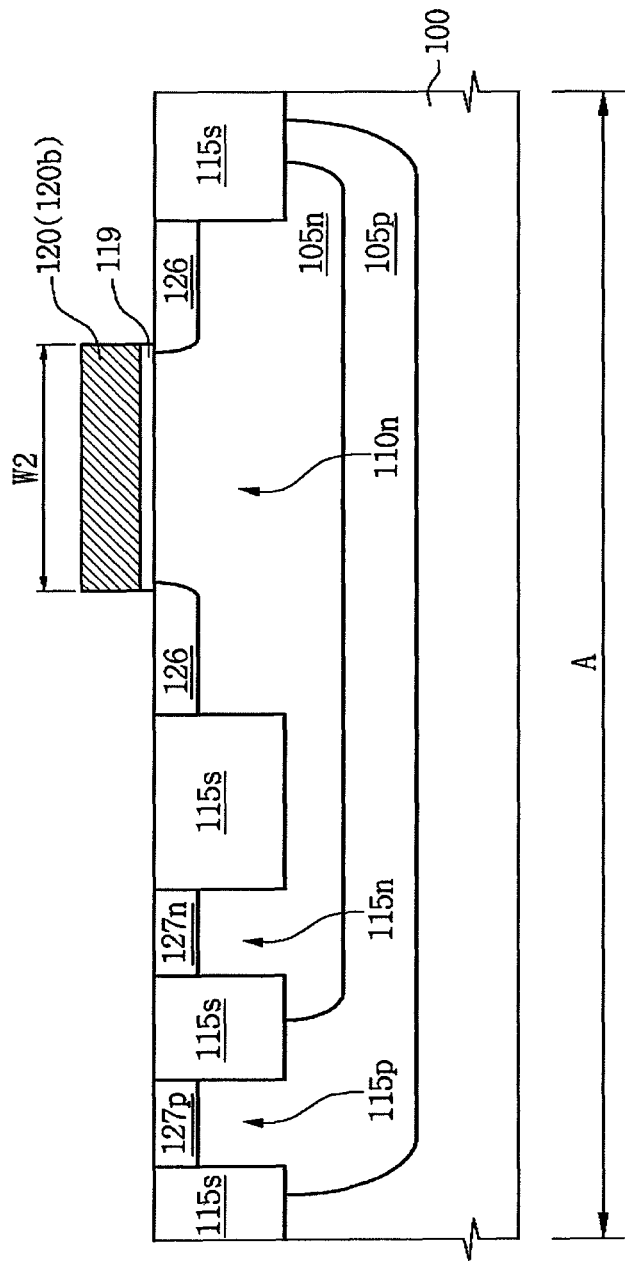
Figure 8B:
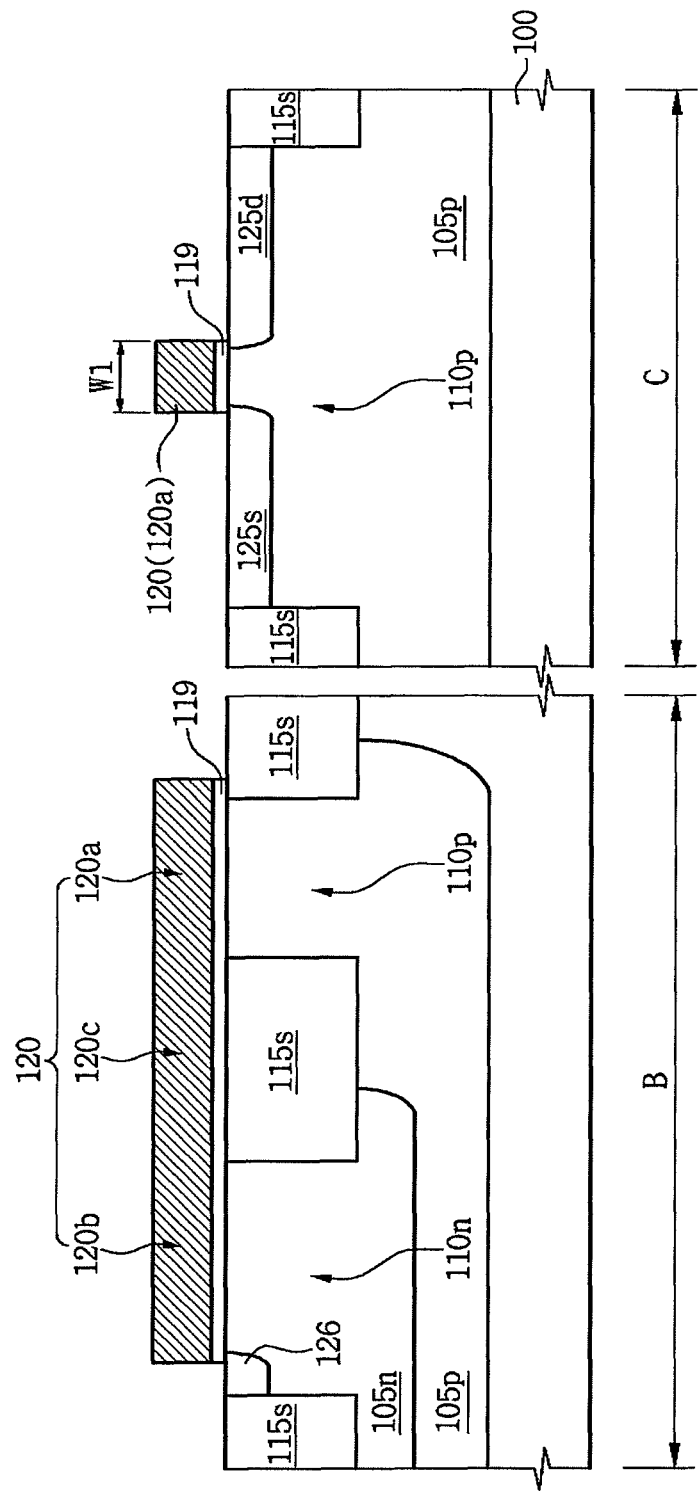

Referring to FIGS. 6, 8A, and 8B, a dielectric material 119 and a conductive material layer may be sequentially formed on the substrate 100 having the first and second well regions 105*p* and 105*n* and the isolation region 115*s*. The dielectric material 119 may be formed of, for example, a thermal oxide layer and/or a high-k dielectric layer. Here, the high-k dielectric layer may refer to a dielectric material having a higher dielectric constant than a silicon oxide layer. For example, the high-k dielectric layer may be a material layer (e.g., a hafnium oxide layer or an aluminum oxide layer) having a higher dielectric constant than a silicon oxide layer. The conductive material layer may be, for example, a doped silicon layer.

According to example embodiments, the conductive material layer may be formed of a conductive material other than a doped silicon layer. For example, the conductive material layer may be formed of a metal layer and/or a metal nitride layer. Alternatively, the conductive material layer may be, for example, a stack layer of at least two of a doped poly-Si layer, a metal layer, and a metal nitride layer.

The conductive material layer may be patterned, thereby forming a floating gate 120. The floating gate 120 may cross over the first active region 110*p* and extend over the second active region 110*n*. Thus, the floating gate 120 may include a first floating gate region 120*a*, which crosses over the first active region 110*p*, and a second floating gate region 120*b*, which is formed on a predetermined region of the second active region 110*n*. A region of the floating gate 120 which vertically overlaps the first active region 110*p* may be defined as the first floating gate region 120*a*, while a region of the floating gate 120 which vertically overlaps the second active region 110*n* may be defined as the second floating gate region 120*b*. Also, a region of the floating gate 120 which is interposed between the first and second floating gate regions 120*a* and 120*b* may be defined as a third floating gate region 120*c*.

According to some example embodiments, the first floating gate region 120*a* may have a smaller planar area than the second floating gate region 120*b*. In other words, an overlap area between the first active region 110*p* and the first floating gate region 120*a* may be smaller than an overlap area between the second active region 110*n* and the second floating gate 120*b*.

Meanwhile, a width W1 of the first floating gate region 120*a* may be smaller than a width W2 of the second floating gate region 120*b*.

First impurity regions 125*s* and 125*d* may be formed in the first active region 110*p* on both sides of the first floating gate region 120*a*. The first impurity regions 125*s* and 125*d* may have a different conductivity type from the first well region 105*p*. For example, when the first well region 105*p* is a p-type well region, the first impurity regions 125*s* and 125*d* may be n-type impurity regions. One 125*s* of the first impurity regions 125*s* and 125*d* may be defined as a source region of a transistor, while the other 125*d* thereof may be defined as a drain region of the transistor.

A second impurity region 126 may be formed in the second active region 110*n* around the second floating gate region 120*b*. The second impurity region 126 may have a different conductivity type from the second well region 105*n*. For example, when the second well region 105*n* is an n-type well region, the second impurity region 126 may be a p-type impurity region.

According to some example embodiments, the second floating gate region 120*b* may partially overlap the second impurity region 126. A region of the second floating gate 120*b* that does not overlap the second impurity region 126 may be smaller than the remaining region of the second floating gate 120*b* that overlaps the second impurity region 126.

A third impurity region 127*p* may be formed in the third active region 115*p* of the first well region 105*p*. The third impurity region 127p may have the same conductivity type as the first well region 105p and a higher dopant concentration than the first well region 105p. The third impurity region 127p may be formed in an upper region of the third active region 115p.

A fourth impurity region 127n may be formed in the fourth active region 115n of the second well region 105n. The fourth impurity region 127n may have the same conductivity type as the second well region 105n and a higher dopant concentration than the second well region 105n. The fourth impurity region 127n may be formed in an upper region of the fourth active region 115n.

According to some example embodiments, the first impurity regions 125s and 125d and the fourth impurity region 127n may have the same conductivity type and be formed at the same time using the same ion implantation process. Also, the second impurity region 126 and the third impurity region 127p may have the same conductivity type and be formed at the same time using the same ion implantation process.

According to other example embodiments, the first through fourth impurity regions 125s, 125d, 126, 127p, and 127n may be formed using different ion implantation processes.

Figure 9B:
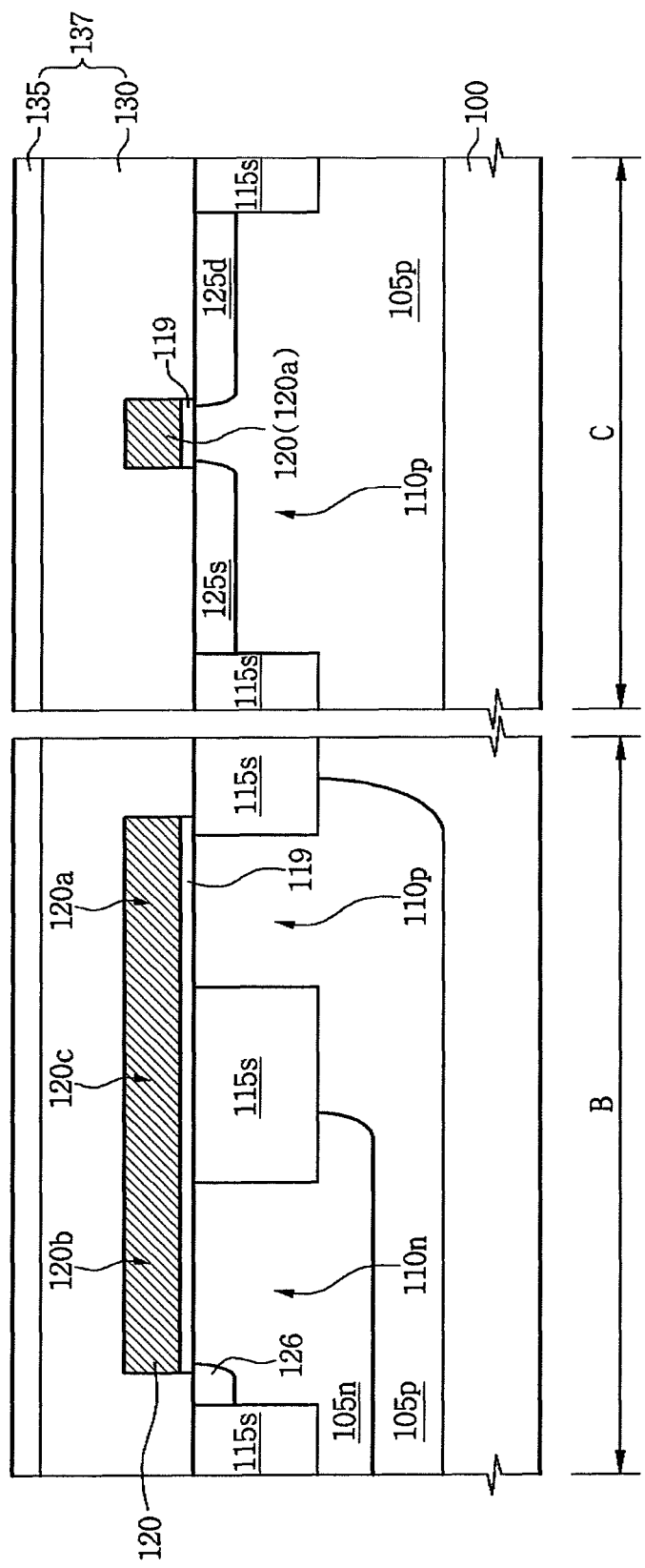

Referring to FIGS. 6, 9A, and 9B, an interlayer insulating layer 137 may be formed on the substrate 100 having the first through fourth impurity regions 125s, 125d, 126, 127p, and 127n. The interlayer insulating layer 137 may include a first insulating layer 130 and a second insulating layer 135 that are stacked sequentially. The first insulating layer 130 may be an insulating material layer, such as, for example, a silicon oxide layer. The second insulating layer 135 may be formed of a material having an etch selectivity with respect to the first insulating layer 130. For instance, when the first insulating layer 130 is formed of a silicon oxide layer, the second insulating layer 135 may be formed of a silicon nitride layer.

Figure 10A:
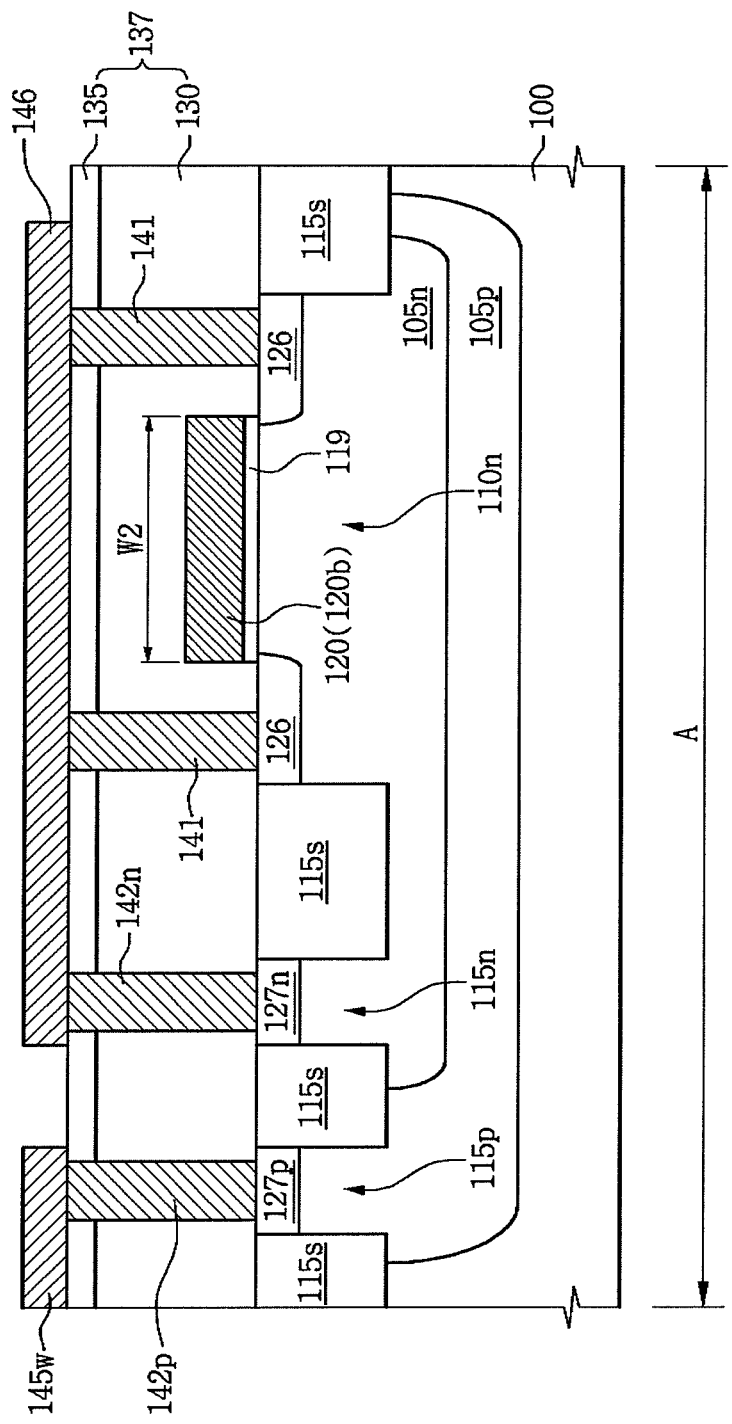

Referring to FIGS. 6, 10A, and 10B, first plugs 140s and 140d may be formed through the interlayer insulating layer 137 and electrically connected to the first impurity regions 125s and 125d. The first plugs 140s and 140d may include a source plug 140s, which is electrically connected to one 125s of the first impurity regions 125s and 125d, and a drain plug 140d, which is electrically connected to the other 125d thereof. A second plug 141 may be formed through the interlayer insulating layer 137 and electrically connected to the second impurity region 126. A third plug 142p may be formed through the interlayer insulating layer 136 and electrically connected to the third impurity region 127p. A fourth plug 142n may be formed through the interlayer insulating layer 137 and electrically connected to the fourth impurity region 127n.

According to some example embodiments, the plugs 140s, 140d, 141, 142p, and 142n may be formed simultaneously. For example, the formation of the plugs 140s, 140d, 141, 142p, and 142n may include forming contact holes through the interlayer insulating layer 137 to expose the first through fourth impurity regions 125s, 125d, 126, 127p, and 127n and filling the contact holes with a conductive material layer. The plugs 140s, 140d, 141, 142p, and 142n may be formed of at least one selected from the group consisting of a poly-Si layer, a metal layer, a metal nitride layer, and a metal-semiconductor compound layer. Here, for example, the metal layer may be a material such as tungsten (W)\or \titanium (Ti), the metal nitride layer may be a material such as a titanium nitride (TiN) layer, and the metal-semiconductor compound layer may be a material such as a titanium silicide (TiSi) layer. The plugs 140s, 140d, 141, 142p, and 142n may be in ohmic contact with the first through third impurity regions 125s, 125d, 126, 127p, and 127n, respectively.

A source interconnection 145s and a drain interconnection 145d may be formed on the interlayer insulating layer 137. The source interconnection 145s may be electrically connected to the source plug 140s to cover the source plug 140s. The drain interconnection 145d may be electrically connected to the drain plug 140d to cover the drain plug 140d. Also, a well interconnection 145w may be formed on the interlayer insulating layer 137. The well interconnection 145w may be electrically connected to the third plug 142p to cover the third plug 142p.

A conductive structure 146 may be formed on the interlayer insulating layer 137. The conductive structure 146 may be electrically connected to the second and fourth plugs 141 and 142n to cover the second and fourth plugs 141 and 142n.

According to some example embodiments, from the plan view, the conductive structure 146 may be formed to cover the floating gate 120. From the plan view, the conductive structure 146 may be formed to completely cover the second active region 110n.

The interconnections 145s, 145d, and 145w and the conductive structure 146 may be formed at the same time. For example, the formation of the interconnections 145s, 145d, and 145w and the conductive structure 146 may include forming a conductive material layer on the substrate 100 having the plugs 140s, 140d, 141, 142p, and 142n and patterning the conductive material layer. Alternatively, the formation of the interconnections 145s, 145d, and 145w and the conductive structure 146 may include forming an intermetal dielectric (IMD) for a damascene process on the substrate 100 having the plugs 140s, 140d, 141, 142p, and 142n, forming trenches in the IMD, and forming a conductive material layer filling the trenches.

Accordingly, the device according to the exemplary embodiment of the present invention as described with reference to FIG. 2 may be formed. For example, the source interconnection 145s may correspond to the source terminal S1 described with reference to FIG. 2, the drain interconnection 145d may correspond to the drain terminal D1 described with reference to FIG. 2, and the well interconnection 145w may correspond to the well terminal W1 described with reference to FIG. 2. Also, the conductive structure 146 may correspond to the antenna A1 and the gate terminal G1, which are electrically connected to each other as described with reference to FIG. 2.

A structure of a device according to some example embodiments will now be described with reference to FIGS. 6, 10A, and 10B.

Referring to FIGS. 6, 10A, and 10B, a first well region 105p and a second well region 105n may be disposed in a predetermined region of a substrate 100. The substrate 100 may be a semiconductor wafer formed of a semiconductor material, such as, for example, silicon. The first well region 105p may have a first conductivity type, and the second well region 106n may have a second conductivity type. The first conductivity type may be a p type, and the second conductivity may be an n type.

An isolation region 115s defining first through fourth active regions 110p, 110n, 115p, and 115n may be disposed in the substrate 100. The first and third active regions 110p and 115p may be defined by the isolation region 115s in the first well region 105p, and the second and fourth active regions 110n and 115n may be defined by the isolation region 115s in the second well region 105n.

According to some example embodiments, from the plan view, the first active region 110p may have a smaller planar area than the second active region 110n.

A floating gate 120 may cross over the first active region 110p and extend over the second active region 110n. The floating gate 120 may be formed of a doped silicon layer.

According to some example embodiments, the floating gate 120 may be formed of a conductive material other than a doped silicon layer. For example, the floating gate 120 may be formed of a material layer, such as a metal layer and/or a metal nitride layer. Alternatively, the floating gate 120 may be formed of, for example, a stacked layer of at least two of a doped polysilicon (poly-Si) layer, a metal layer, and a metal nitride layer.

The floating gate 120 may include a first floating gate region 120a and a second floating gate region 120b. The first floating gate region 120a may cross over the first active region 110p, and the second floating gate region 120b may be disposed on a predetermined region of the second active region 110n. A region of the floating gate 110 which vertically overlaps the first active region 110p may be defined as a first floating gate region 120a, while a region of the floating gate 110 which vertically overlaps the second active region 110n may be defined as a second floating gate region 120b.

A region of the floating gate 120 which is interposed between the first and second floating gate regions 120a and 120b may be defined as a third floating gate region 120c.

According to some example embodiments, in the floating gate 120, the first floating gate region 120a may have a smaller planar area than the second floating gate region 120b. In other words, an overlap area between the first active region 110p and the first floating gate 120a may be smaller than an overlap area between the second active region 110n and the second floating gate region 120b.

According to some example embodiments, a width W1 of the first floating gate region 120a may be smaller than a width W2 of the second floating gate region 120b.

First impurity regions 125s and 125d may be disposed in the first active region 110p on both sides of the first floating gate region 120a. The first impurity regions 125s and 125d may have a different conductivity type from the first well region 105p. For example, when the first well region 105p is a p-type well region, the first impurity regions 125s and 125d may be n-type impurity regions.

A second impurity region 126 may be disposed in the second active region 110n around the second floating gate region 120b. The second impurity region 126 may have a different conductivity type from the second well region 105n. For instance, when the second well region 105n is an n-type well region, the second impurity region 126 may be a p-type impurity region.

A third impurity region 127p may be disposed in the third active region 115p of the first well region 105p. The third impurity region 127p may have the same conductivity type as the first well region 105p and a higher dopant concentration than the first well region 105p. The third impurity region 127p may be formed in an upper region of the third active region 115p.

A fourth impurity region 127n may be disposed in the fourth active region 115n of the second well region 105n. The fourth impurity region 127n may have the same conductivity type as the second well region 105n and a higher dopant concentration than the second well region 105n. The fourth impurity region 127n may be formed in an upper region of the fourth active region 115n.

A dielectric material 119 may be interposed between the first floating gate region 120a and the first active region 105p and between the second floating gate region 120b and the second active region 105n. The dielectric material 119 may be formed of, for example, a thermal oxide layer and/or a high-k dielectric layer. Here, the high-k dielectric layer may refer to a dielectric material having a higher dielectric constant than a silicon oxide layer.

An interlayer insulating layer 137 may be disposed to cover the first through fourth impurity regions 125s, 125d, 126, 127p, and 127n and the floating gate 120. The interlayer insulating layer 137 may include a first insulating layer 130 and a second insulating layer 135 that are stacked sequentially. The first insulating layer 130 may be an insulating material layer, such as, for example, a silicon oxide layer. The second insulating layer 135 may be formed of a material having an etch selectivity with respect to the first insulating layer 130. For example, when the first insulating layer 130 is a silicon oxide layer, the second insulating layer 135 may be a silicon nitride layer.

First plugs 140s and 140d may be disposed through the interlayer insulating layer 137 and electrically connected to the first impurity regions 125s and 125d. The first plugs 140s and 140d may include a source plug 140s, which is electrically connected to one 125s of the first impurity regions 125s and 125d, and a drain plug 140d, which is electrically connected to the other 125d thereof.

A second plug 141 may be disposed through the interlayer insulating layer 137 and electrically connected to the second impurity region 126. A third plug 142p may be disposed through the interlayer insulating layer 137 and electrically connected to the third impurity region 127p. A fourth plug 142n may be disposed through the interlayer insulating layer 137 and electrically connected to the fourth impurity region 127n.

The plugs 140s, 140d, 141, 142p, and 142n may include at least one selected from the group consisting of, for example, a poly-Si layer, a metal layer, a metal nitride layer, and a metal-semiconductor compound layer. Here, for example, the metal layer may be a material such as tungsten (W) or titanium (Ti), the metal nitride layer may be a material such as a titanium nitride (TiN) layer, and the metal-semiconductor compound layer may be a material such as a titanium silicide (TiSi) layer. The plugs 140s, 140d, 141, 142p, and 142n may be in ohmic contact with the first through fourth impurity regions 125s, 125d, 126, 127p, and 127n, respectively.

A source interconnection 145s, a drain interconnection 145d, and a well interconnection 145w may be disposed on the interlayer insulating layer 137. The source interconnection 145s may be electrically connected to the source plug 140s to cover the source plug 140s. The well interconnection 145w may be electrically connected to the third plug 142p to cover the third plug 142p. A conductive structure 146 may be disposed on the interlayer insulating layer 137. The conductive structure 146 may be electrically connected to the second and fourth plugs 141 and 142n to cover the second and fourth plugs 141 and 142n. The interconnections 145s, 145d, and 145w and the conductive structure 146 may be formed of the same material. For example, the interconnections 145s, 145d, and 145w and the conductive structure 146 may include a conductive metal material, such as aluminum (Al), tungsten (W), copper (Cu), or titanium (Ti).

According to some example embodiments, from the plan view, the conductive structure 146 may be disposed to cover the floating gate 120. Furthermore, the conductive structure 146 may completely cover the floating gate 120. Thus, the conductive structure 146 may completely cover the floating gate 120 to prevent externally generated UV light from arriving in the floating gate 120. Accordingly, electrons in the floating gate 120 may not be excited, thereby preventing the electrical properties of the floating gate 120 from being changed.

According to some example embodiments, from the plan view, the conductive structure 146 may completely cover the second active region 110n. Furthermore, the conductive structure 146 may cover not only the second active region 110n but also the floating gate 120. The conductive structure 146 may completely cover not only the second active region 110n but also the floating gate 120. As described above, as the conductive structure 146 completely covers the second active region 110n, the externally generated UV light may be prevented from arriving in the second active region 110n to generate electron-hole pairs or increase a reverse current, thereby preventing the device from being affected by the externally generated UV light.

In the present embodiment, the first and second well regions 105p and 105n, the isolation region 105s, the first through fourth active regions 110p, 110n, 115p, and 115n, the first through fourth impurity regions 125s, 125d, 126, 127p, and 127n, and the floating gate 120 may respectively correspond to the first and second well regions 5p and 5n, the isolation region 5s, the first through fourth active regions 10p, 10n, 15p, and 15n, the first through fourth impurity regions 25s, 25d, 26, 27p, and 27n, and the first and second floating gates 20a and 20b described above with reference to FIG. 2.

Also, the source interconnection 145s may correspond to the source terminal S1 described with reference to FIG. 2, the drain interconnection 145d may correspond to the drain terminal D1 described with reference to FIG. 2, and the well interconnection 145w may correspond to the well terminal W1 described with reference to FIG. 2.

Also, the conductive structure 146 may correspond to the antenna A1 and the gate terminal G1 described with reference to FIG. 2. That is, the conductive structure 146 may function not only as the antenna A1 of FIG. 2 but also as the gate terminal G1 of FIG. 2.

Accordingly, a first device M1' corresponding to the first device M1 described with reference to FIG. 2 may be provided.

Hereinafter, a method of forming a device for analyzing and/or monitoring a generated amount of negative charges according to other example embodiments will be described with reference to FIGS. 11 through 12B.

Figure 11:
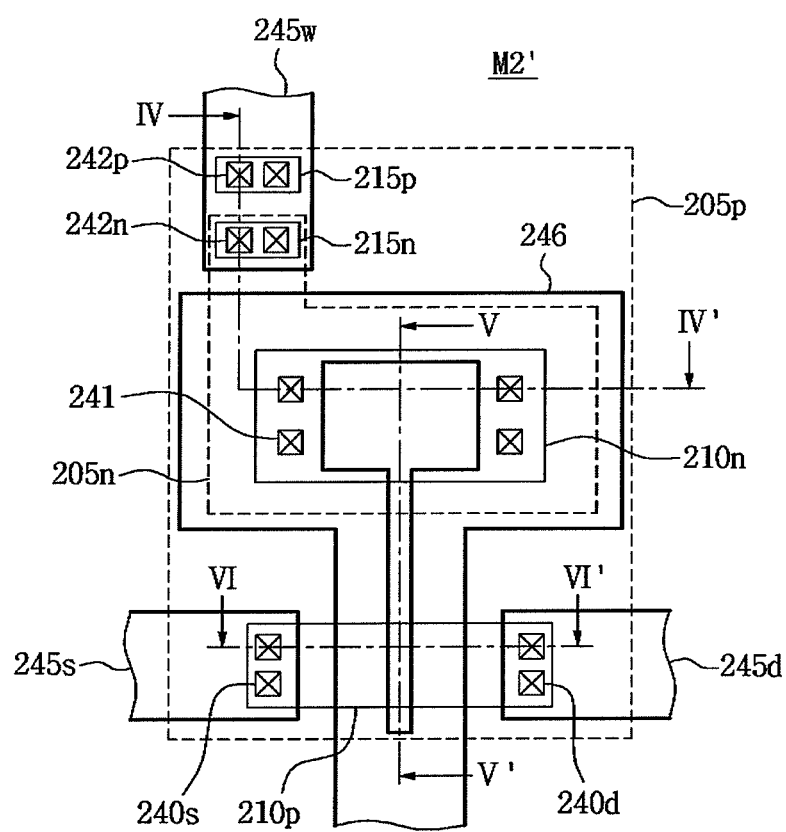
FIG. 11 is a plan view of a device according to an example embodiment.
Figure 12A:
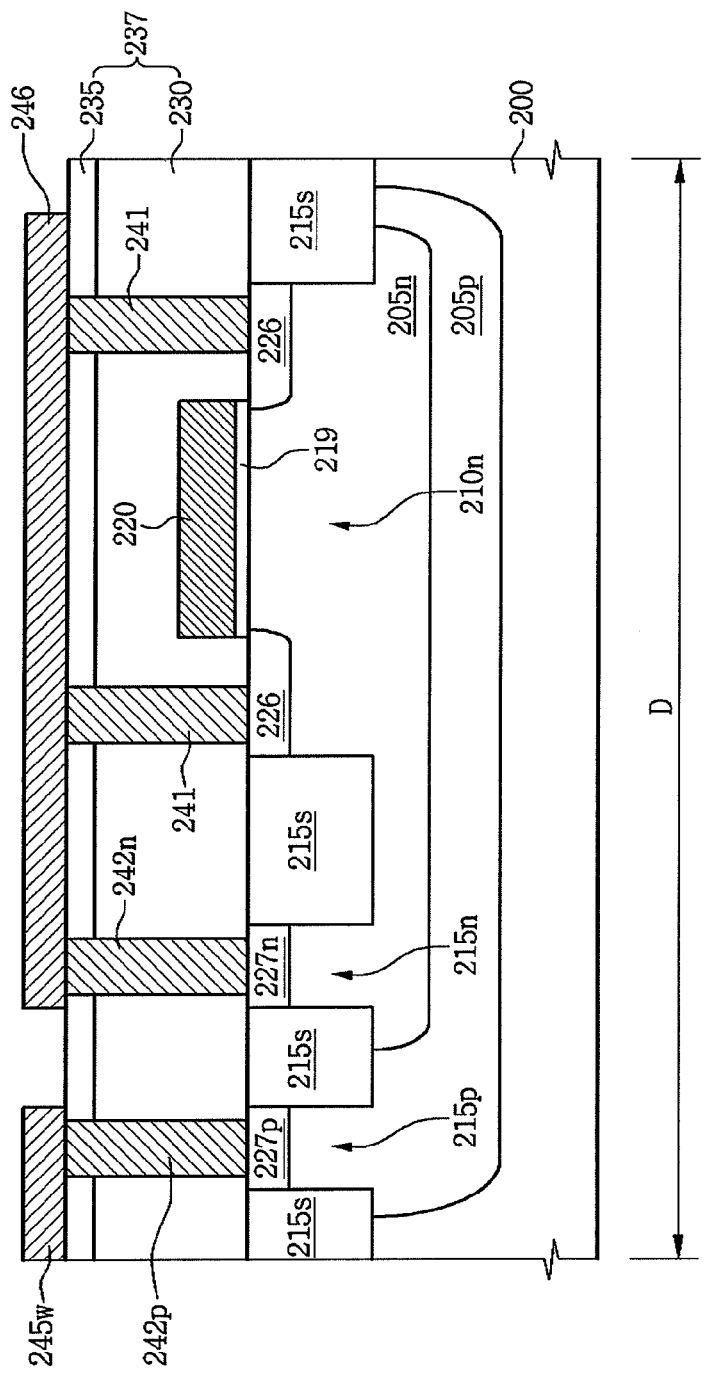
FIGS. 12A and 12B are cross-sectional views of the device of FIG. 11.
Figure 12B:
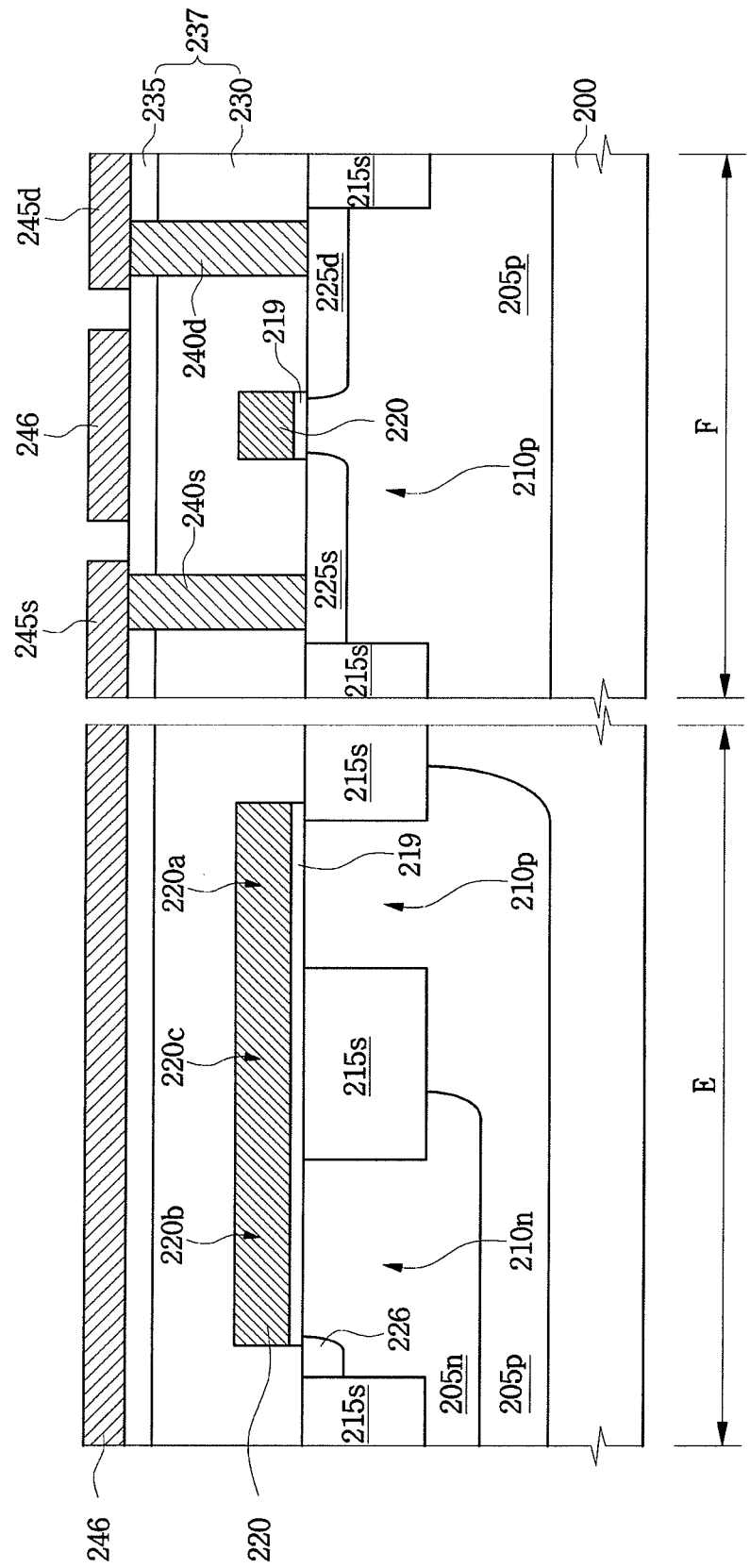

FIG. 11 is a plan view of a device for analyzing and/or monitoring a generated amount of negative charges according to other example embodiments, and FIGS. 12A and 12B are cross-sectional views of the device of FIG. 11. In FIGS. 11 through 12B, reference character "D" denotes a region taken along line IV-IV' of FIG. 11, "E" denotes a region taken along line V-V' of FIG. 11, and "F" denotes a region taken along line VI-VI' of FIG. 11.

Referring to FIGS. 11, 12A, and 12b, a substrate 200 may be prepared. The substrate 200 may be a semiconductor wafer formed of a semiconductor material, such as, for example, silicon. Substantially the same method as described with reference to FIGS. 7A and 7B, 8A and 8B, and 9A and 9B may be performed on the substrate 200. Thus, first and second well regions 205p and 205n, first through fourth active regions 210p, 210n, 215p, and 215n, an isolation region 215s, a dielectric material 219, a floating gate 220, first through fourth impurity regions 225s, 225d, 226, 227p, and 227n, and an interlayer insulating layer 237 may be formed in the substrate 200. The floating gate 220 may include first through third floating gate regions 220a, 220b, and 220c. The interlayer insulating layer 237 may include a first insulating layer 230 and a second insulating layer 235 that are stacked sequentially.

According to some example embodiments, the second well region 205n of FIG. 11 may have a different planar shape from the second well region 105n of FIG. 6. For example, from the plan view, the second well region 105 of FIG. 6 may be formed in a rectangular shape, while the second well region 205 of FIG. 11 may be formed in a rectangular shape with a protruding portion. However, the present embodiments are not limited to planar shapes of well regions. For example, from the plan view, the second well region 205n of FIG. 11 and the second well region 105n of FIG. 6 may be formed in the same shape.

First plugs 240s and 240d may be formed through the interlayer insulating layer 247 and electrically connected to the first impurity regions 225s and 225d. The first plugs 240s and 240d may include a source plug 240s, which is electrically connected to one 225s of the first impurity regions 225s and 225d, and a drain plug 240d, which is electrically connected to the other 225d thereof.

A second plug 241 may be formed through the interlayer insulating layer 237 and electrically connected to the second impurity region 226. A third plug 242p may be formed through the interlayer insulating layer 237 and electrically connected to the third impurity region 227p. A fourth plug 242n may be formed through the interlayer insulating layer 237 and electrically connected to the fourth impurity region 227n. The plugs 240s, 240d, 241, 242p, and 242n may be formed using substantially the same method as the plugs 140s, 140d, 141, 142p, and 142n described with reference to FIGS. 10A and 10B.

A source interconnection 245s and a drain interconnection 245d may be formed on the interlayer insulating layer 237. The source interconnection 245s may be electrically connected to the source plug 240s to cover the source plug 240s. The drain interconnection 245d may be electrically connected to the drain plug 240d to cover the drain plug 240d. Also, a well interconnection 245w may be formed on the interlayer insulating layer 237. The well interconnection 245w may be electrically connected to the third and fourth plugs 242p and 242n to cover the third and fourth plugs 242p and 242n. Furthermore, a conductive structure 246 may be formed on the interlayer insulating layer 237. The conductive structure 246 may be electrically connected to the second plug 241 to cover the second plug 241.

According to some example embodiments, from the plan view, the conductive structure 246 may be formed to cover the floating gate 220. Furthermore, from the plan view, the conductive structure 246 may be formed to completely cover the floating gate 220.

The interconnections 245s, 245d, and 245w and the conductive structure 246 may be formed using substantially the same method as the interconnections 145s, 145d, and 145w and the conductive structure 146 described with reference to FIGS. 10A and 10B except for a few variations in layouts and electrical connection methods.

According to some example embodiments, the source interconnection 245s may correspond to the source terminal S2 described with reference to FIG. 3, the drain interconnection 245d may correspond to the drain terminal D2 described with reference to FIG. 3, and the well interconnection 245w may correspond to the well terminal W2 described with reference to FIG. 3. Also, the conductive structure 246 may correspond to the antenna A2 and the gate terminal G2, which are electrically connected to each other as described with reference to FIG. 3.

A structure of a device according to other example embodiments will now be described with reference back to FIGS. 11, 12A, and 12B.

Referring to FIGS. 11, 12A, and 12B, a substrate 200 may be prepared. The substrate 200 may be a semiconductor wafer formed of a semiconductor material, such as silicon. First and second well regions 205p and 205n, first through fourth active regions 210p, 210n, 215p, and 215n, an isolation region 215s, a dielectric material 219, a floating gate 220, first through fourth impurity regions 225s, 225d, 226, 227p, and 227n and an interlayer insulating layer 237 may be formed in the substrate 200 to respectively correspond to the first and second well regions 105p and 105n, the first through fourth active regions 110p, 110n, 115p, and 115n, the isolation region 115s, the dielectric material 119, the floating gate 120, the first through fourth impurity regions 125s, 125d, 126, 127p, and 127n, and the interlayer insulating layer 137 described with reference to FIGS. 6, 10A, and 10B.

According to some example embodiments, the second well region 205n of FIG. 11 may have a different planar shape from the second well region 105n of FIG. 6. For example, from the plan view, the second well region 105 of FIG. 6 may have a rectangular shape, while the second well region 205 of FIG. 11 may have a rectangular shape with a protruding portion. However, the present embodiments are not limited to planar shapes of well regions. For example, from the plan view, the second well region 205n of FIG. 11 may be formed in the same shape as the second well region 105n of FIG. 6.

First plugs 240s and 240d may be formed through the interlayer insulating layer 237 and electrically connected to the first impurity regions 225s and 225d. The first plugs 240s and 240d may include a source plug 240s, which is electrically connected to one 225s of the first impurity regions 225s and 225d, and a drain plug 240d, which is electrically connected to the other 225d thereof.

Second, third, and fourth plugs 241, 242p, and 242n may be formed through the interlayer insulating layer 237. The second, third, and fourth plugs 241, 242p, and 242n may be electrically connected to the second, third, and fourth impurity regions 226, 227p, and 227n, respectively.

A source interconnection 245s and a drain interconnection 245d may be formed on the interlayer insulating layer 237. The source interconnection 245s may be electrically connected to the source plug 240s to cover the source plug 240s. The drain interconnection 245d may be electrically connected to the drain plug 240d to cover the drain plug 240d.

A well interconnection 245w may be formed on the interlayer insulating layer 237. The well interconnection 245w may be electrically connected to the third and fourth plugs 242p and 242n to cover the third and fourth plugs 242p and 242n.

A conductive structure 246 may be formed on the interlayer insulating layer 237. The conductive structure 246 may be electrically connected to the second plug 241 to cover the second plug 241.

According to some example embodiments, from the plan view, the conductive structure 246 may cover the floating gate 220. Furthermore, from the plan view, the conductive structure 246 may completely cover the floating gate 220.

According to some example embodiments, from the plan view, the conductive structure 246 may completely cover the second active region 210n. Furthermore, the conductive structure 246 may cover not only the second active region 210n but also the floating gate 220. The conductive structure 246 may completely cover the second active region 210n and the floating gate 220. Accordingly, externally generated UV may be prevented from arriving in the second active region 210n and affecting the device.

According to some example embodiments, the source interconnection 245s may correspond to the source terminal S2 described with reference to FIG. 3, the drain interconnection 245d may correspond to the drain terminal D2 described with reference to FIG. 3, and the well interconnection 245w may correspond to the well terminal W2 described with reference to FIG. 3. Also, the conductive structure 246 may correspond to the antenna A2 and the gate terminal G2, which are electrically connected to each other as described with reference to FIG. 3.

Accordingly, a second device M2' corresponding to the second device M2 described above with reference to FIG. 3 may be provided.

Hereinafter, a method of forming a device for analyzing and/or monitoring a generated amount of UV light according to other example embodiments will be described with reference to FIGS. 13 through 14B.

Figure 13:
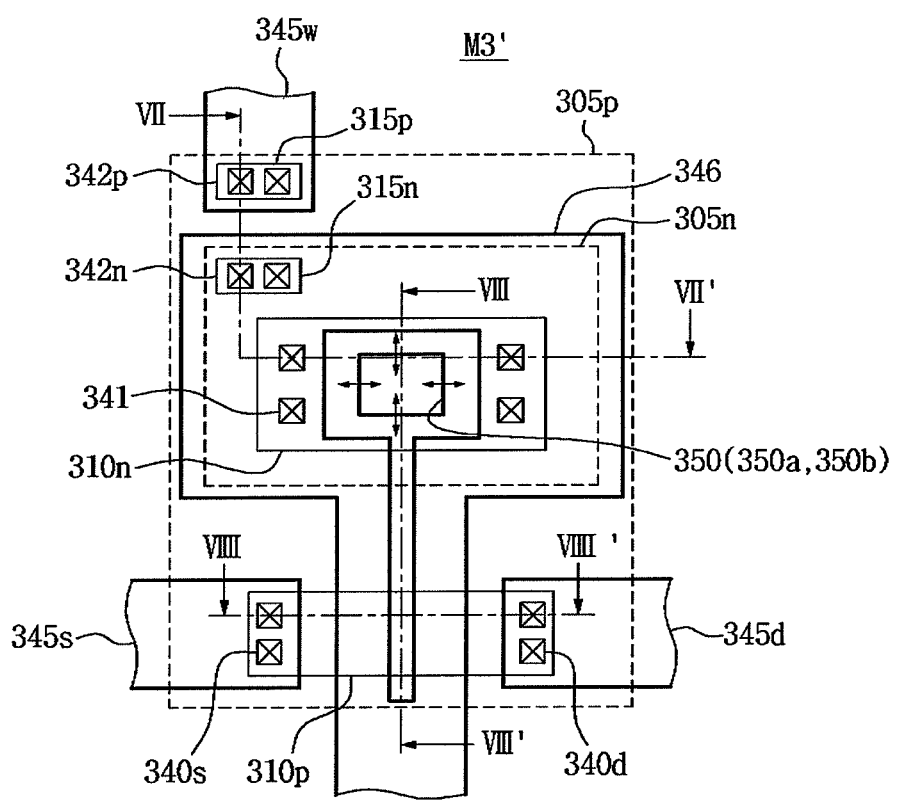
FIG. 13 is a plan view of a device according to an example embodiment.
Figure 14A:
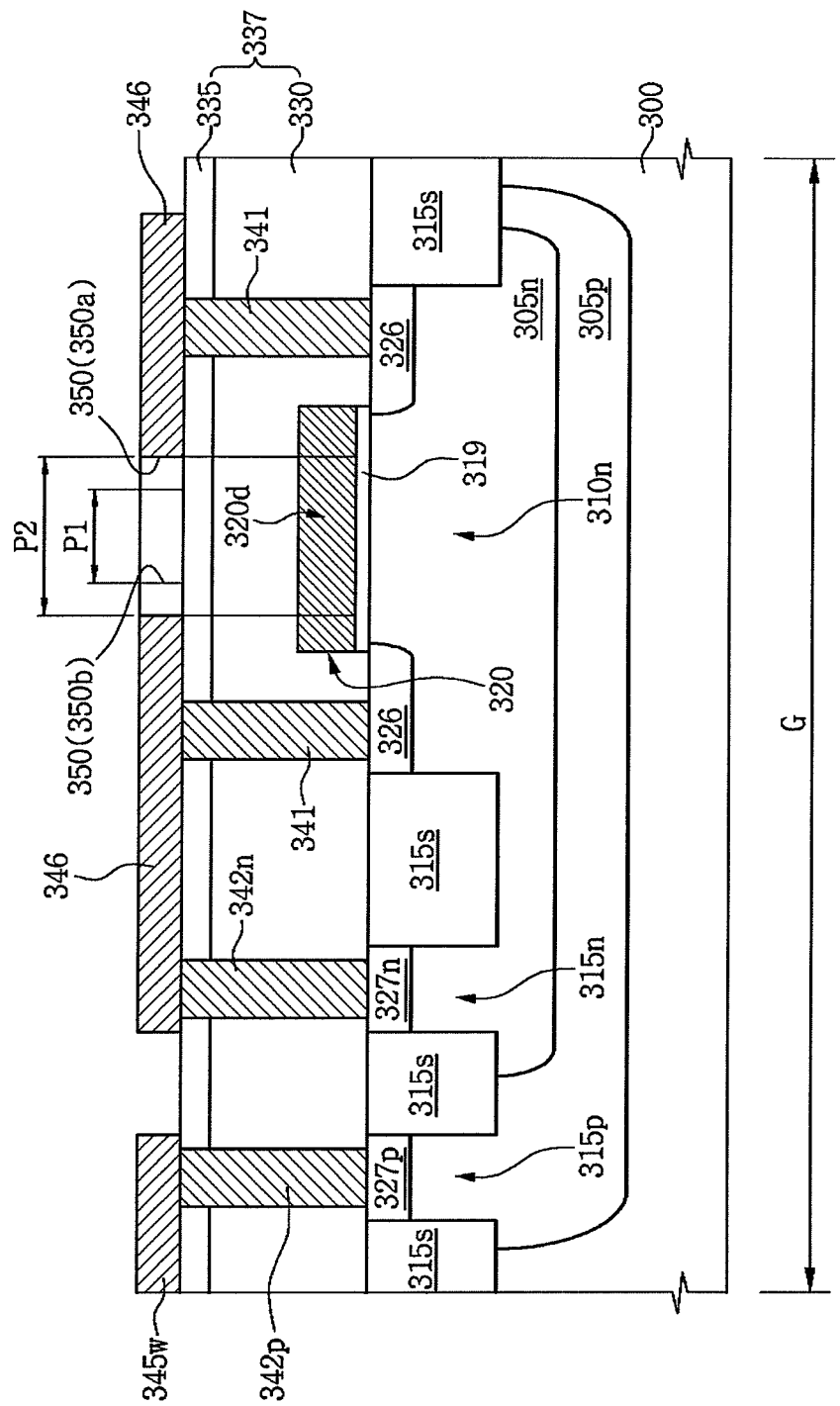
FIGS. 14A and 14B are cross-sectional views of the device of FIG. 13.
Figure 14B:
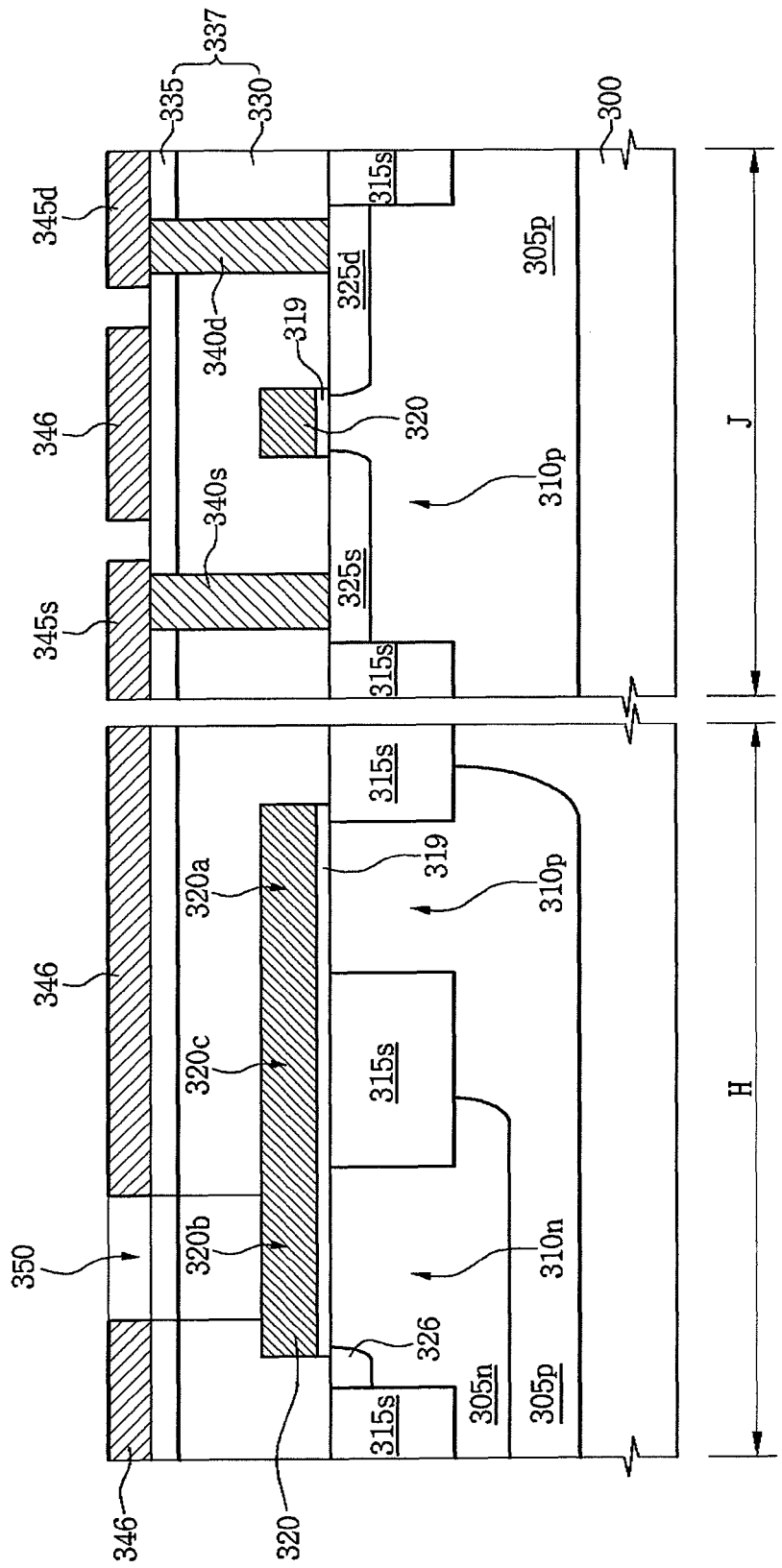

FIG. 13 is a plan view of a device according to still other example embodiments, and FIGS. 14A and 14B are cross-sectional view of the device of FIG. 13. In FIGS. 13 through 14B, reference character "G" denotes a region taken along line VII-VII' of FIG. 13, "H" denotes a region taken along line VIII-VIII' of FIG. 13, and "J" denotes a region taken along line VIIII-VIIII' of FIG. 13.

Referring to FIGS. 13, 14A, and 14B, a substrate 300 may be prepared. The substrate 300 may be a semiconductor wafer formed of a semiconductor material, such as, for example, silicon. Substantially the same method as described with reference to FIGS. 7A, 7B, 8A, 8B, 9A, and 9B may be performed on the substrate 300.

Thus, first and second well regions 305p and 305n, first through fourth active regions 310p, 310n, 315p, and 315n, an isolation region 315s, a dielectric material 319, a floating gate 320 including first through third floating gate regions 320a, 320b, and 320c, first through fourth impurity regions 325s, 325d, 326, 327p, and 327n), and an interlayer insulating layer 337 including a first insulating layer 330 and a second insulating layer 335 that are stacked sequentially may be formed in the substrate 300 to respectively correspond to the first and second well regions 15p and 15n, the first through fourth active regions 110p, 110n, 115p, and 115n, the isolation region 115s, the dielectric material 119, the floating gate 120 including the first through third floating gate regions 120a, 120b, and 120c, the first through fourth impurity regions 125s, 125d, 126, 127p, and 127n, and the interlayer insulating layer 137 including the first insulating layer 130 and the second insulating layer 135 that are stacked sequentially, which are described with reference to FIGS. 7A through 9B.

First plugs 340s and 340d may be formed through the interlayer insulating layer 337 and electrically connected to the first impurity regions 325s and 325d. The first plugs 340s and 340d may include a source plug 340s, which is electrically connected to one 325s of the first impurity regions 325s and 325d, and a drain plug 340d, which is electrically connected to the other 325d thereof. A second plug 341 may be formed through the interlayer insulating layer 337 and electrically connected to the third impurity region 326. A third plug 342p may be formed through the interlayer insulating layer 337 and electrically connected to the third impurity region 327p. A fourth plug 342n may be formed through the interlayer insulating layer 337 and electrically connected to the fourth impurity region 327n. The plugs 340s, 340d, 341, 342p, and 342n may be formed using substantially the same method as the plugs 140s, 140d, 141, 142p, and 142n described with reference to FIGS. 10A and 10B.

A source interconnection 345s and a drain interconnection 345d may be formed on the interlayer insulating layer 337. The source interconnection 345s may be electrically connected to the source plug 340s to cover the source plug 340s, and the drain interconnection 345d may be electrically connected to the drain plug 340d to cover the drain plug 340d. A well interconnection 345w may be formed on the interlayer insulating layer 337. The well interconnection 345w may be electrically connected to the third plug 342p to cover the third plug 342p. A conductive structure 346 may be formed on the interlayer insulating layer 337. The conductive structure 346 may be electrically connected to the second and fourth plugs 341 and 342n to cover the second and fourth plugs 341 and 342n.

From the plan view, the conductive structure 346 may be formed to have a window (e.g., opening 350) exposing a predetermined region of the floating gate 320. From the plan view, the opening 350 of the conductive structure 346 may expose at least a portion of the second floating gate region 320b of the floating gate 320.

According to example embodiments, the opening 350 of the conductive structure 346 may have a smaller planer area than the second floating gate region 320b.

The interconnections 345s, 345d, and 345w and the conductive structure 346 may be formed using substantially the same method as the interconnections 145s, 145d, and 145w and the conductive structure 146 described with reference to FIGS. 10A and 10B except for a few variations in the layout of the conductive structure.

According to the present embodiment, the source interconnection 345s may correspond to the source terminal S3 described with reference to FIG. 4, and the drain interconnection 345d may correspond to the drain terminal D3 described with reference to FIG. 3. The well interconnection 345w may correspond to the well terminal W2 described with reference to FIG. 3, and the conductive structure 346 may correspond to the gate terminal G3 described with reference to FIG. 3. A portion 320d of the floating gate 320 which is exposed by the opening 350 may correspond to the antenna A3 described with reference to FIG. 3.

A structure of a device according to other example embodiments will now be described with reference back to FIGS. 13, 14A, and 14B.

Referring to FIGS. 13, 14A, and 14B, a substrate 300 may be prepared. The substrate 300 may be a semiconductor wafer formed of a semiconductor material, such as, for example, silicon. First and second well regions 305p and 305n, first through fourth active regions 310p, 310n, 315p, and 315n, an isolation region 315s, a dielectric material 319, a floating gate 320, first through fourth impurity regions 325s, 325d, 326, 327p, and 327n, an interlayer insulating layer 337, and first through fourth plugs 340s, 340d, 341, 342p, and 342n may be formed in the substrate 300 to respectively correspond to the first and second well regions 105p and 105n, the first through fourth active regions 110p, 110n, 115p, and 115n, the isolation region 115s, the dielectric material 119, the floating gate 120, the first through fourth impurity regions 125s, 125d, 126, 127p, and 127n, the interlayer insulating layer 137, and the first through fourth plugs 140s, 140d, 141, 142p, and 142n described with reference to FIGS. 6, 10A, and 10B.

A source interconnection 345s, a drain interconnection 345d, and a well interconnection 345w may be formed on the interlayer insulating layer 337. The source interconnection 345s may be electrically connected to the source plug 340s to cover the source plug 340s. The drain interconnection 345d may be electrically connected to the drain plug 340d to cover the drain plug 340d. The well interconnection 345w may be electrically connected to the third plug 342p to cover the third plug 342p.

A conductive structure 346 may be formed on the interlayer insulating layer 337. The conductive structure 346 may be electrically connected to the second and fourth plugs 341 and 342n to cover the second and fourth plugs 341 and 342n.

From the plan view, the conductive structure 346 may be formed to have an opening 350 exposing a predetermined region of the floating gate 320. From the plan view, the opening 350 of the conductive structure 346 may expose at least a portion of the second floating gate region 320b of the floating gate 320.

According to some example embodiments, the opening 350 of the conductive structure 346 may have a smaller planar area than the second floating gate region 320b.

The opening 350 of the conductive structure 346 may function as a window through which UV light generated during a plasma process arrives in the floating gate 320.

The conductive structure 346 may vertically overlap the second impurity region 326 of the second active region 310n. Accordingly, the conductive structure 346 may cover the second impurity region 326 to prevent UV light generated during the plasma process from arriving in the second impurity region 326. Also, the conductive structure 346 may be formed to have the opening 350 functioning as a window through which the UV light generated during the plasma process arrives in the floating gate 320.

According to example embodiments, the size of the opening 350 may be varied to control the sensitivity of the device to UV light. The opening 350 of the conductive structure 346 may be formed as a first opening 350a having a first width P1 or a second opening 350b having a second width P2 greater than the first width P1. Here, the second opening 350b may be formed to a larger planar area than the first opening 350a.

According to example embodiments, the third device may include a plurality of devices having windows with different sizes, namely, openings 350a and 350b. For example, the third device may include a first UV detection unit having the first opening 350b with a first width P1 and a second UV detection unit having the second opening 350a with a second width P2 greater than the first width P1. Here, the second opening 350a may have a greater planar area than the first opening 350b.

The source interconnection 345s may correspond to the source terminal S3 described with reference to FIG. 4, the drain interconnection 345d may correspond to the drain terminal D3 described with FIG. 3, the well interconnection 345w may correspond to the well terminal W2 described with reference to FIG. 3, and the conductive structure 346 may correspond to the gate terminal G3 described with reference to FIG. 3. A portion 320d of the floating gate 320 which is exposed by the opening 350 may correspond to the antenna A3 described with reference to FIG. 3.

Accordingly, a third device M3' corresponding to the third device M3 described with reference to FIG. 4 may be provided.

Figure 15:
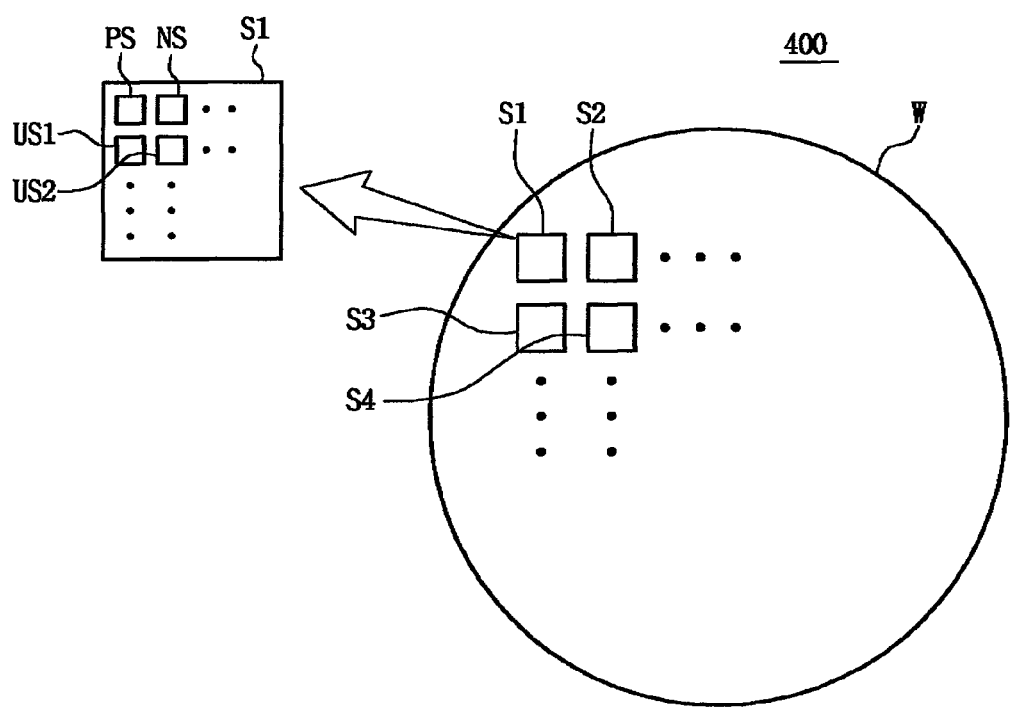
FIG. 15 is a diagram of a device according to an example embodiment.

According to some example embodiments, as shown in FIG. 15, a device 400 including one or a plurality of sensor blocks S1, S2, S3, S4, . . . capable of analyzing and/or monitoring at least one of a generated amount of positive charges, a generated amount of negative charges, and a generated amount of UV light may be provided. The sensor blocks S1, S2, S3, S4 . . . may be formed on a wafer W.

According to some example embodiments, the wafer W may be a semiconductor wafer. Accordingly, the device 400 may be formed as a wafer type.

Each of the sensor blocks S1, S2, S3, S4 . . . may include, for example, a first device PS for analyzing and/or monitoring the generated amount of positive charges, a second device NS for analyzing and/or monitoring the generated amount of negative charges, and a third device US1 and US2 for analyzing and/or monitoring the generated amount of UV light. Here, the first device PS for analyzing and/or monitoring the generated amount of positive charges may correspond to the first device M1 or M1' described with reference to FIGS. 2 and 6, the second device NS for analyzing and/or monitoring the generated amount of negative charges may correspond to the second device M2 or M2' described with reference to FIGS. 3 and 11, and the third device US1 and US2 for analyzing and/or monitoring the generated amount of UV light may correspond to the third device M3 or M3' described with reference to FIGS. 5 and 13.

According to some example embodiments, the third device US1 and US2 may include, for example, a first UV detection unit US1 and a second UV detection unit US2, which have different sensitivities to UV light. For example, the first UV detection unit US1 may be a unit having the first opening 350a as described with reference to FIG. 14A, and the second UV detection unit US2 may be a unit having the second opening 350b with a greater planar area than the first opening 350a. Accordingly, as described with reference to FIG. 14A, a plurality of UV detection units US1, US2, . . . having the openings 350a and 350b with different planar areas may be provided to control sensitivity to UV light.

Figure 16:
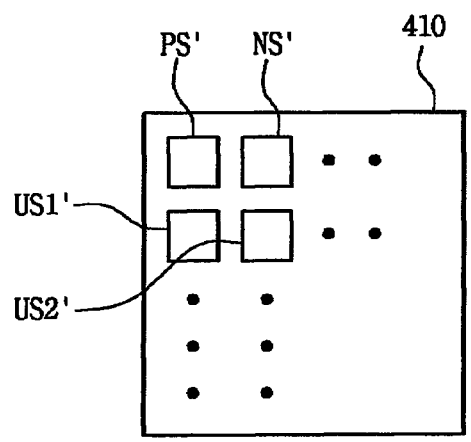
FIG. 16 is a diagram of a device according to an example embodiment.

Meanwhile, as shown in FIG. 16, a device 410 including at least one of first through third devices PS', NS', US1', US2', . . . capable of analyzing and/or monitoring at least one of a generated amount of positive charges, a generated amount of negative charges, and a generated amount of UV light may be provided. The device 410 may be formed as, for example, a semiconductor-chip type.

The semiconductor-chip-type device 410 may be a device having the same shape as the wafer-type device 400 of FIG. 15, in which one of the sensor blocks S1, S2, S3, S4 . . . is formed as a chip type. Thus, the device 410 may include at least one of first through third devices PS', NS', US1', US2', . . . corresponding respectively to the first through third devices PS, NS, US1, US2, . . . of FIG. 15.

Figure 17:
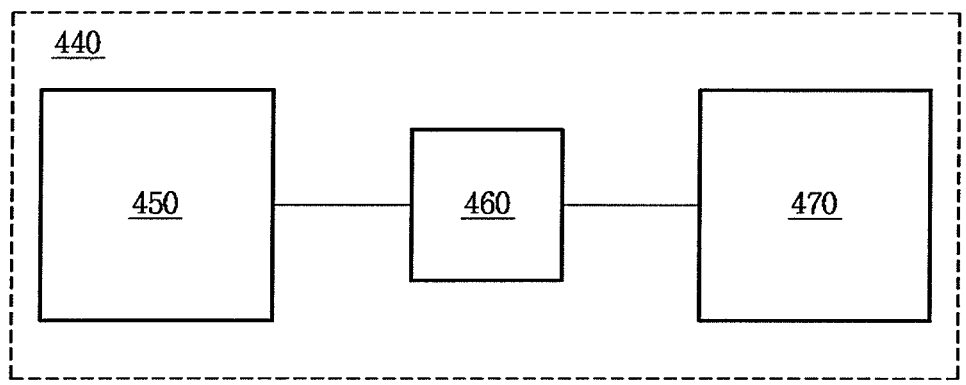
FIG. 17 is a diagram of a system including a device according to an example embodiment.

A system 440 using devices according to example embodiments will now be described with reference to FIG. 17. The system 440 may include a process chamber 450, a device 460, and an analysis/monitoring unit 470.

The process chamber 450 may be a device in which a semiconductor process may be performed using, for example, plasma. For example, the process chamber 450 may be a device in which a deposition or etching process may be performed using plasma.

The device 460 may include at least one of, for example, first through third devices inside the process chamber 450 and/or outside the process chamber 450. The first device may be used to analyze and/or monitor a generated amount of positive charges, the second device may be used to analyze and/or monitor a generated amount of negative charges, and the third device may be used to analyze and/or monitor a generated amount of UV light. For example, the device 460 may include the first device M1 or M1', the second device M2 or M2', and the third device M3 or M3', which are described above.

The analysis/monitoring unit 470 may be a device capable of detecting a variation in threshold voltage of the device 460. For example, the analysis/monitoring unit 470 may include a unit capable of measuring a threshold voltage of a MOSFET. For instance, the analysis/monitoring unit 470 may include a probe and/or a measurement module, which may apply a voltage to each of a gate, source, drain, and body of a MOSFET and measure the voltage thereof. Here, the body may refer to a well region.

According to some example embodiments, the device 460 may be loaded into the process chamber 450, and a plasma process may be performed. Here, the device 460 may be a wafer-type device 400 described with reference to FIG. 16. Accordingly, the device 460 may be exposed to positive charges, negative charges, and UV light generated during the plasma process. After that, a variation in threshold voltage of the device 460 may be analyzed and monitored. For example, as the device 460 may include at least one of the first device M1 or M1', the second device M2 or M2', and the third device M3 or M3' as described above, a variation in threshold voltage of the first device M1 or M1' with respect to the generated amount of positive charges, a variation in threshold voltage of the second device M2 or M2' with respect to the generated amount of negative charges, and a variation in threshold voltage with respect to the generated amount of UV light may be detected. Thereafter, the threshold voltages of the first device M1 or M1', the second device M2 or M2', and the third device M3 or M3', which constitute the device 460, may be initialized as described with reference to FIGS. 2 through 4 and 5.

According to other example embodiments, the device 460 may be disposed not to be in direct contact with charges of plasma generated during a plasma process using the process chamber 450 but to be exposed to plasma-generated UV light. For example, the device 460 may be disposed outside the process chamber 450 so that the device 460 may be exposed to UV light passing through the window of the process chamber 450. Thereafter, the amount of UV light generated during a plasma process using the process chamber 450 may be analyzed and/or monitored using the device 460 and the analysis/monitoring unit 470.

Application Example 1

Figure 18:
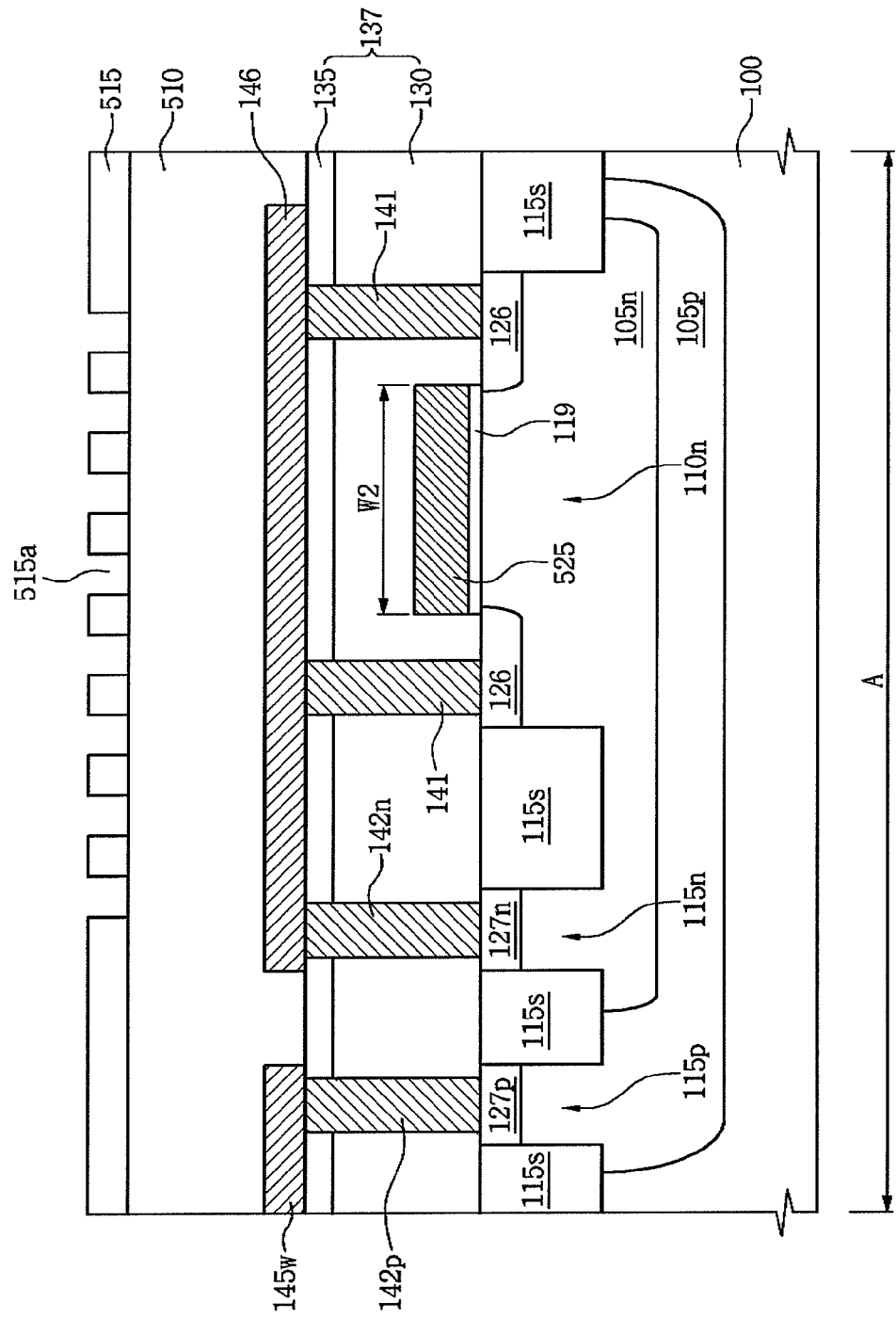
FIGS. 18 through 20 are diagrams of a first application example of a device according to an example embodiment.
Figure 19A:
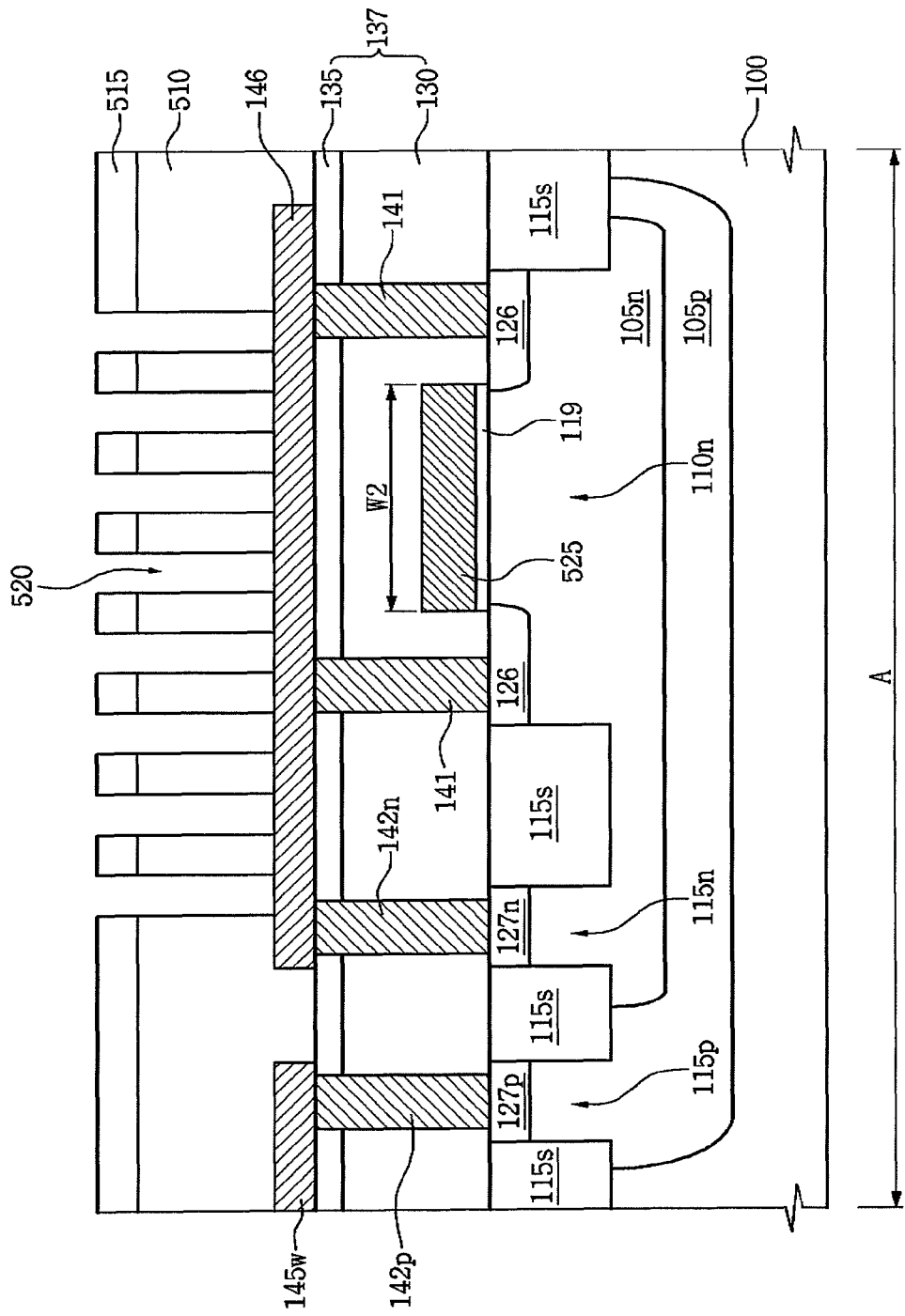
Figure 19B:
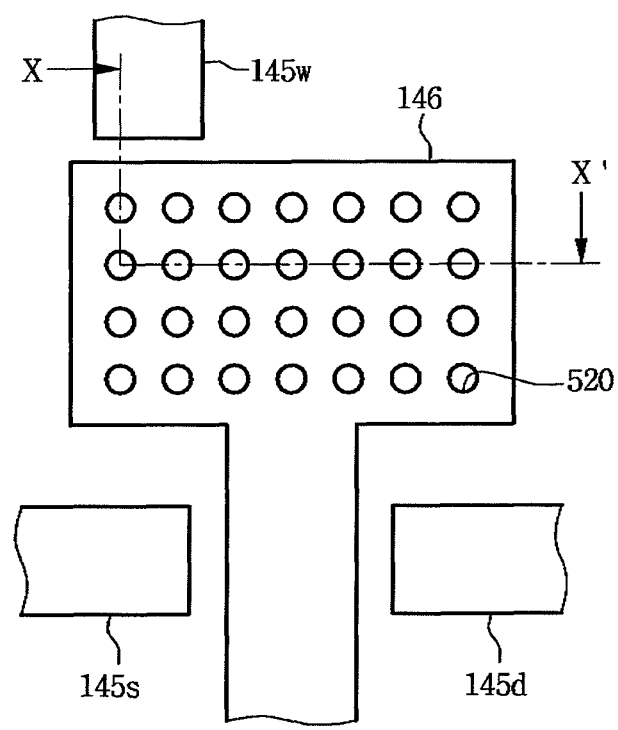
Figure 20:
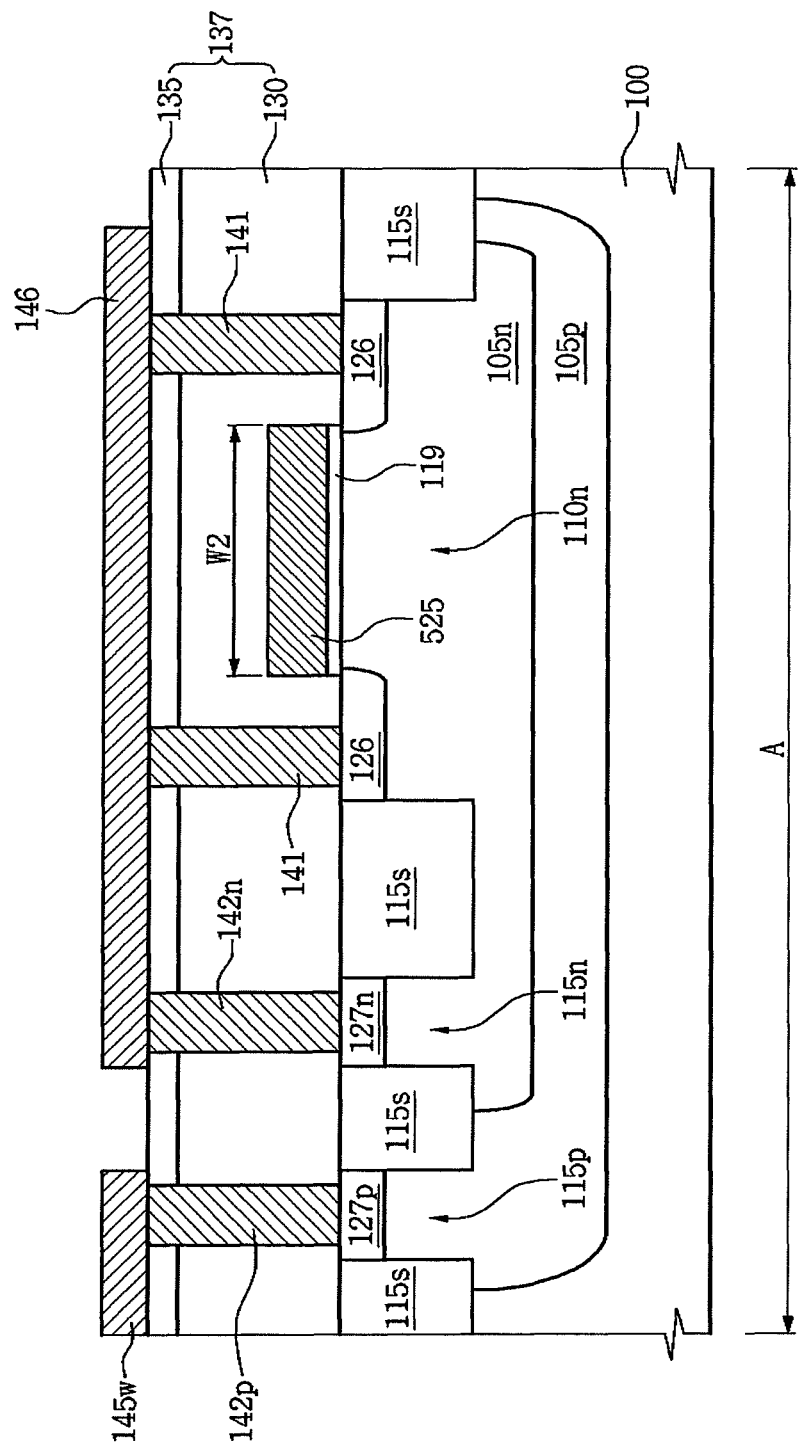

A method of analyzing and/or monitoring an amount of charges generated during the formation of a contact hole using a plasma etching process will now be described with reference to FIGS. 18 through 20. In FIGS. 18 through 20, FIGS. 18, 19A, and 20 are cross-sectional views taken along line I-I' of the first device M1' of FIG. 6, and FIG. 19B is a plan view of the interconnections 145s, 145d, and 145w and the conductive structure 146 of FIG. 6 and the contact holes 520 of FIG. 19A for brevity. Line X-X' of FIG. 19B may correspond to line I-I' of FIG. 6.

Referring to FIGS. 5 and 18, a device having an initial threshold voltage may be prepared (S100). Here, the device may be a device 400 described with reference to FIG. 15. FIGS. 18 through 20 may illustrate a region of the device 400 which is used to measure and analyze a generated amount of positive charges. For example, FIGS. 18 through 20 may illustrate the first device M1" described with reference to FIGS. 10A and 10B.

A plasma-free oxide layer 510 may be formed on the device 400. The plasma-free oxide layer 510 may be used to prevent the device 400 from being exposed to plasma during the formation of the plasma-free oxide layer 510. Also, the oxide layer 510 may be formed of a material having an etch selectivity with respect to the interconnections 145s, 145d, and 145w, the conductive structure 146, and the second insulating layer 135. For example, the oxide layer 510 may be formed of a material such as spin-on-glass (SOG).

A contact mask pattern 515 having openings 515a may be formed on the oxide layer 510. The contact mask pattern 515 may be formed of a material having an etch selectivity with respect to a photoresist layer or the oxide layer 510.

Referring to FIGS. 5, 19A, and 19B, a plasma etching process may be performed using the contact mask pattern 515 as an etch mask. As a result, contact holes 520 may be formed through the oxide layer 510 to partially expose the conductive structure 146. Here, as shown in FIG. 19B, the contact holes 520 may be formed to expose the conductive structure 146.

During the formation of the contact holes 520, the conductive structure 146 may be exposed to positive and negative charges of plasma and UV light (S110). As a result, a floating gate 525 with changed electrical properties may be provided. Accordingly, as described above with reference to FIGS. 2 and 5, a threshold voltage of a transistor of the device may be varied (S120).

Referring to FIGS. 5 and 20, a plasma-free etching process may be performed to avoid substantially etching the interconnections 145s, 145d, and 145w, the conductive structure 146, and the second insulating layer 135, thereby removing the contact mask pattern 515 and the oxide layer 510. For example, the plasma-free etching process may be a wet etching process using fluoric acid.

Thereafter, as described with reference to FIGS. 2 and 5, results may be analyzed (S130). Accordingly, a variation in threshold voltage with respect to the amount of positive charges generated during a plasma etching process for forming the contact holes 520 may be detected. Similarly, when a plasma etching process for forming the contact holes 520 is performed on the second device M2' of FIGS. 11 through 12B and the third device M3' of FIGS. 14 through 14B, a variation in threshold voltage with respect to the generated amount of negative charges and a variation in threshold voltage with respect to the generated amount of UV light may be detected.

Thereafter, as described above with reference to FIGS. 2 and 5, a threshold voltage of the device may be initialized (S140).

Application Example 2

A method of analyzing and/or monitoring an amount of charges generated during a semiconductor process for forming patterns will now be described with reference to FIGS. 21A through 22B. In FIGS. 21A through 22B, FIGS. 21A and 22A are plan views of the interconnections 145s, 145d, and 145w and the conductive structure 146 of FIG. 6, and FIGS. 21B and 22B are diagrams of regions taken along lines XI-XI' of FIGS. 21A and 22A, respectively.

Figure 21A:
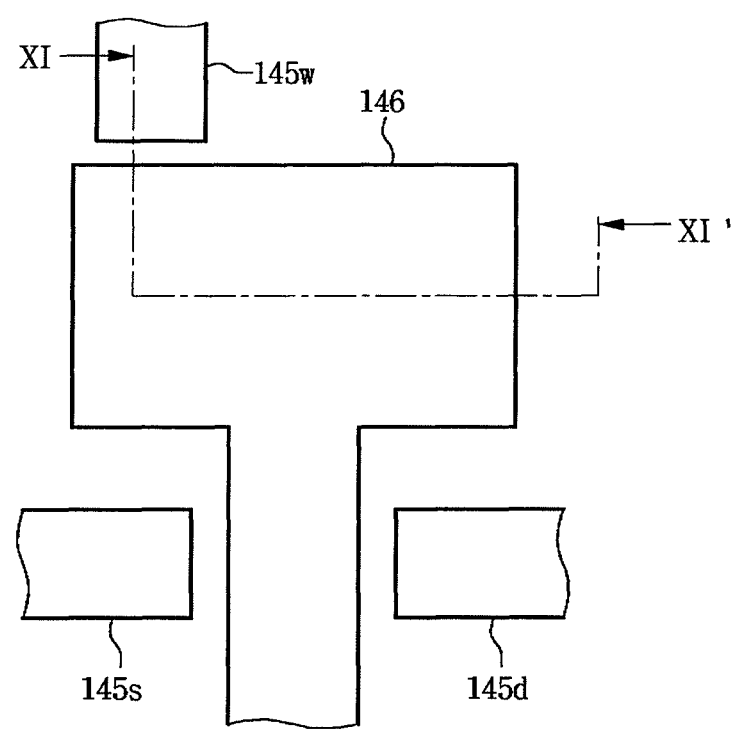
FIGS. 21A through 22B are diagrams of a second application example of a device according to an example embodiment.
Figure 21B:
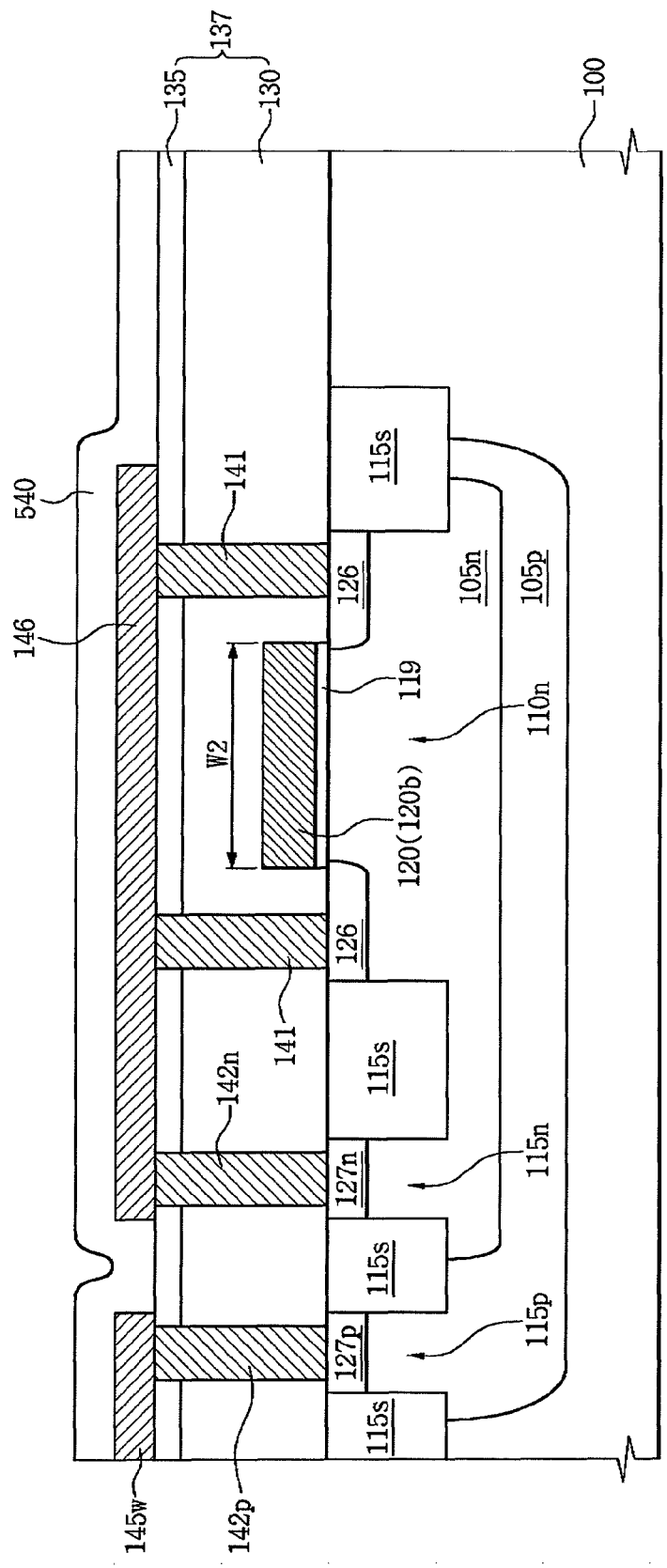

Referring to FIGS. 5, 21A, and 21B, a device described with reference to FIGS. 6, 10A, and 10B may be prepared (S100). A layer 540 for forming patterns may be formed on the device. The layer 540 may be, for example, a poly-Si layer and/or a metal layer for forming interconnections. Here, the layer 540 may be formed of a material having an etch selectivity with respect to the interconnections 145s, 145d, and 145w, the conductive structure 146, and the second insulating layer 135. For example, when the interconnections 145s, 145d, and 145w and the conductive structure 146 are formed of an aluminum (Al) layer or copper (Cu) layer and the second insulating layer 135 is a silicon nitride layer, the layer 540 may be a poly-Si layer.

Figure 22A:
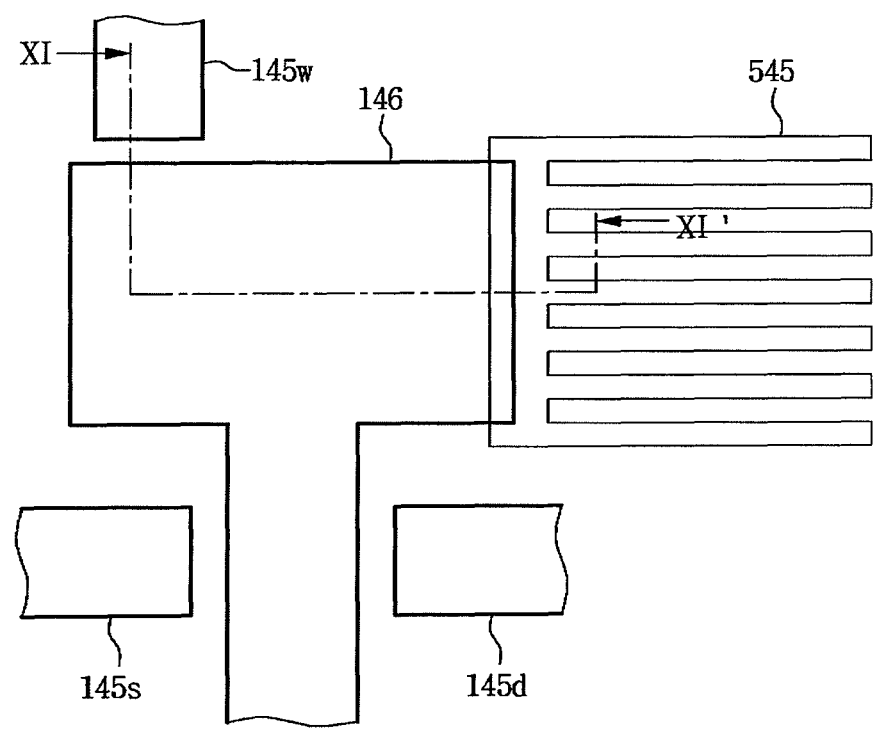
Figure 22B:
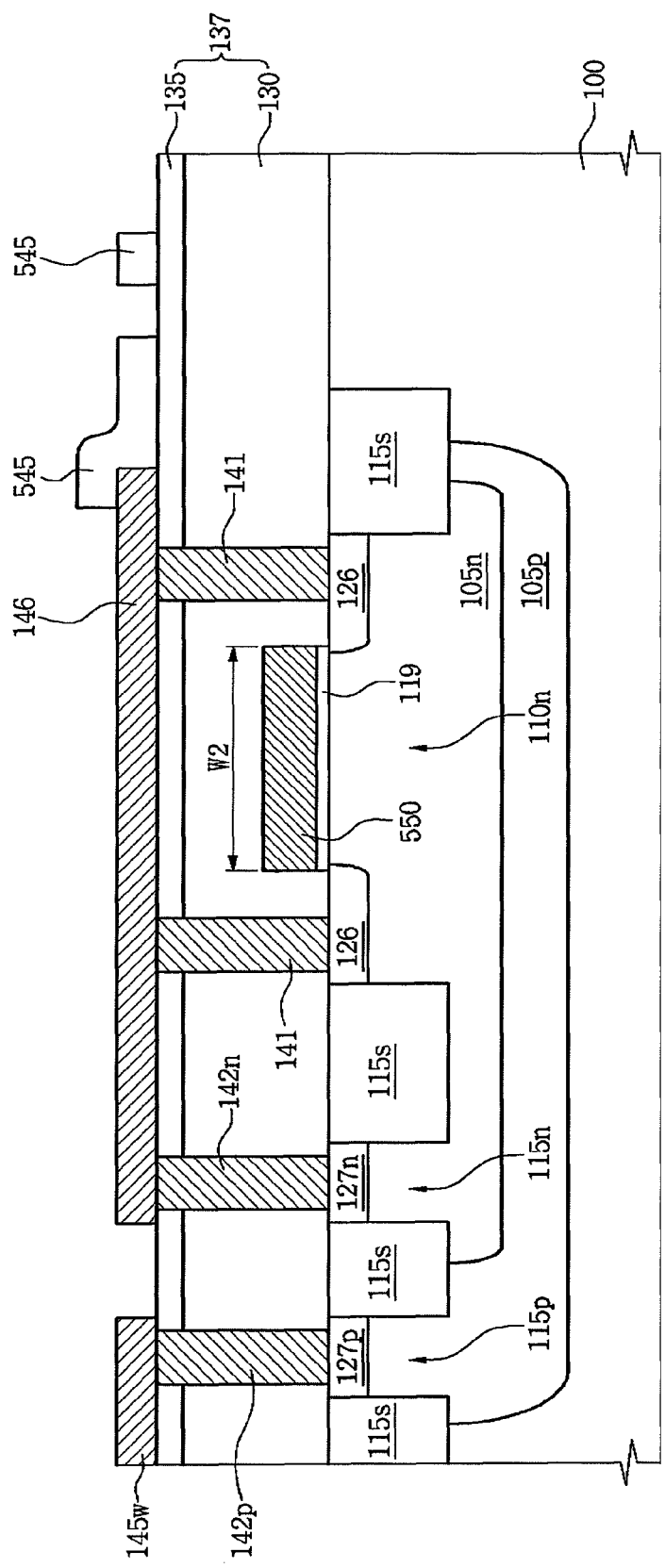

Referring to FIGS. 5, 22A, and 22B, photolithography and etching processes may be performed on the layer 540, thereby forming patterns 545. An etching process for forming the patterns 545 may be an etching process using, for example, plasma. Here, during the plasma etching process, the conductive structure 146 may be exposed to positive charges or negative charges of plasma (S110). As a result, as described with reference to FIGS. 3 and 5, a floating gate 550 with changed electrical properties may be formed. Accordingly, as described above with reference to FIGS. 2 and 5, a threshold voltage of a transistor of the device may be changed (S120).

Thereafter, as described above with reference to FIGS. 2 and 5, results may be analyzed (S130). Accordingly, a variation in threshold voltage with respect to the amount of positive charges generated during the plasma etching process for forming the patterns 545 may be detected. Similarly, a plasma etching process for forming the patterns 545 may be performed on the second device M2' described with reference to FIGS. 11 through 12B and the third device M3' described with reference to FIGS. 13 through 14B. In this case, a variation in threshold voltage with respect to the generated amount of negative charges and a variation in threshold voltage with respect to the generated amount of UV light may be detected. Thereafter, as described with reference to FIGS. 2 and 5, a threshold voltage of the device may be initialized (S140)

Meanwhile, after initializing the threshold voltage of the device, the patterns 545 may be removed using, for example, a plasma-free etching process. Alternatively, for example, before initializing the threshold voltage of the device, the patterns 545 may be removed.

Application Example 3

A method of analyzing and/or monitoring an amount of charges generated during a deposition process using plasma will now be described with reference to FIGS. 5, 23, and 24.

Figure 23:
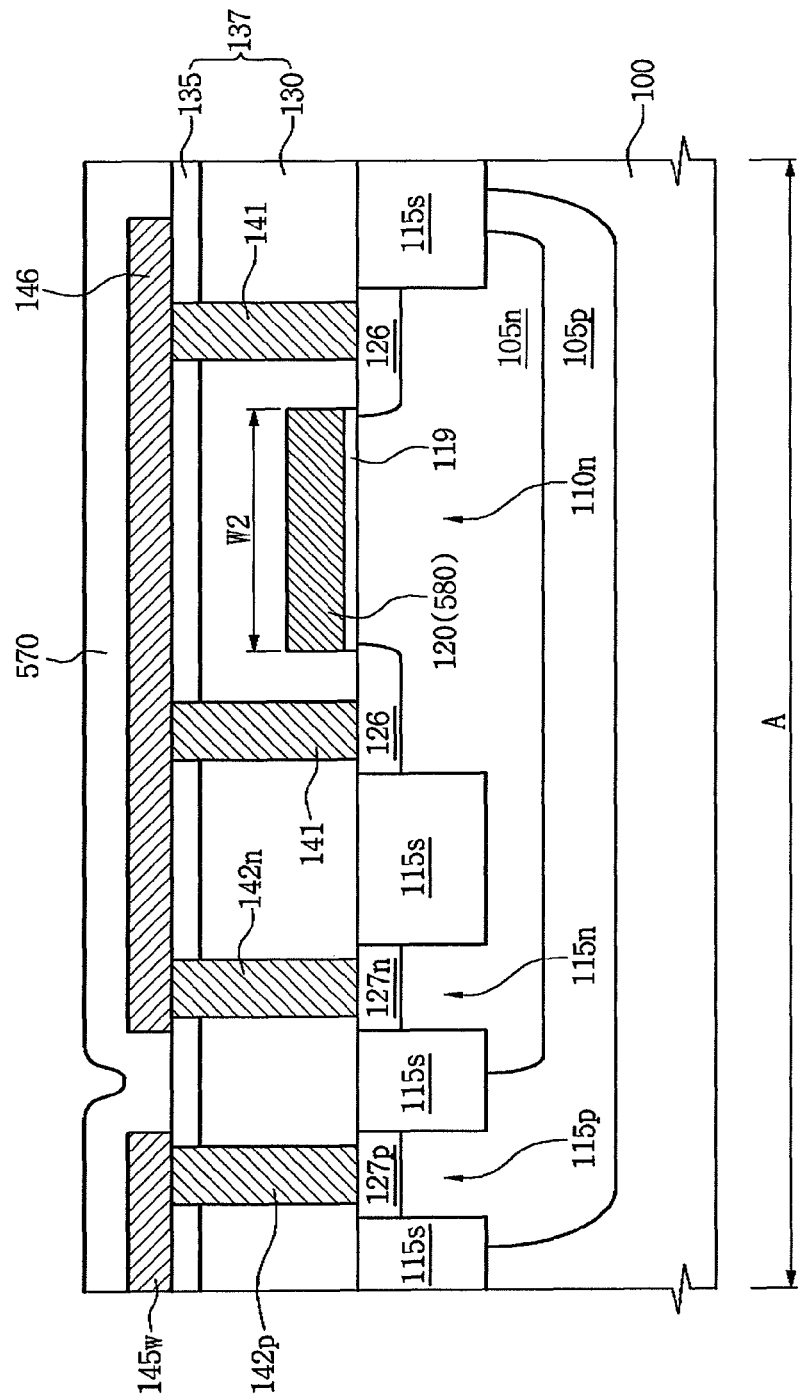
FIGS. 23 and 24 are diagrams of a third application example of a device according to an example embodiment.

Referring to FIGS. 5 and 23, a device described with reference to FIGS. 6, 10A, and 10B may be prepared (S100). A deposition process using plasma may be performed on the device, thereby forming a layer 570. The layer 570 may be formed of a material having an etch selectivity with respect to the interconnections 145s, 145d, and 145w, the conductive structure 146, and the second insulating layer 135. For example, when the interconnections 145s, 145d, and 145w and the conductive structure 146 are formed of an aluminum (Al) layer or copper (Cu) layer and the second insulating layer 135 is a silicon nitride layer, the layer 570 may be a silicon oxide layer formed using plasma.

During the formation of the layer 570, the conductive structure 146 may be exposed to positive charges or negative charges (S110). Thus, an initial floating gate 120 may be formed as a floating gate 580 with changed electrical properties.

Figure 24:
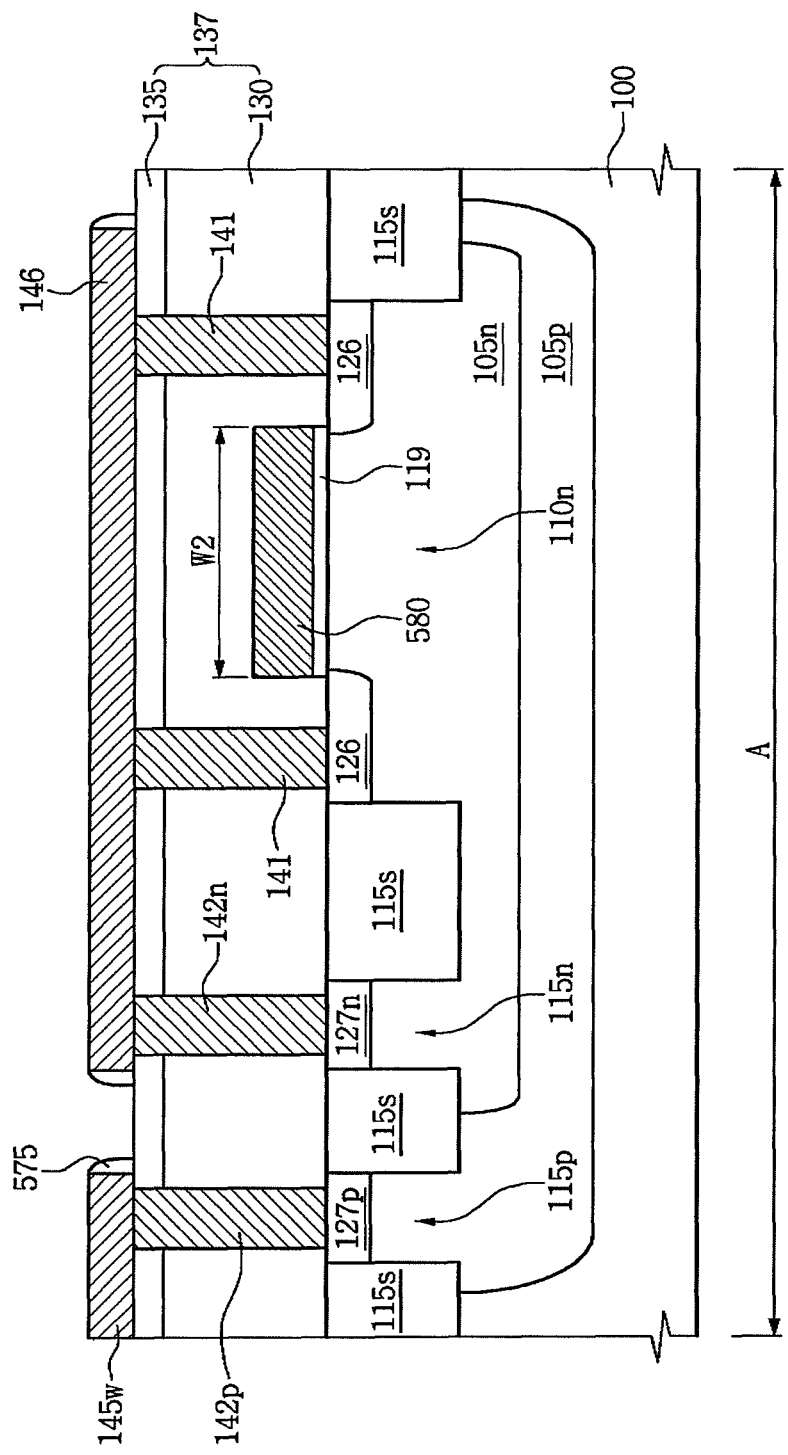

Referring to FIG. 24, the layer 570 may be etched using an etching process (e.g., wet etching process) without plasma until top surfaces of at least the interconnections 145s, 145d, and 145w and the conductive structure 146 are exposed. As a result, a portion of the layer 570 may remain on sidewalls of the interconnections 145s, 145d, and 145w and the conductive structure 146 to form sidewall spacers 575. However, the layer 570 may be wholly removed so that the sidewall spacers 575 are not formed.

Thereafter, as described above with reference to FIGS. 2 and 5, results may be analyzed (S130). Thus, a variation in threshold voltage with respect to the amount of positive charges generated during the plasma deposition process for forming the layer 570 may be detected. Similarly, a plasma deposition process for forming the layer 570 may be performed on the second device M2' described with reference to FIGS. 11 through 12B and the third device M3' described with reference to FIGS. 13 through 14B. In this case, a variation in threshold voltage with respect to the generated amount of negative charges and a variation in threshold voltage with respect to the generated amount of UV light may be detected. Thereafter, as described with reference to FIGS. 2 and 5, a threshold voltage of the device may be initialized (S140).

According to example embodiments, a device capable of analyzing a generated amount of positive charges, a generated amount of negative charges, and a generated amount of UV light may be provided. The device may include a transistor and a CCG between which a floating gate is shared. As the floating gate is shared between the transistor and the CCG of the device, the device can be simply configured and the cost and the time taken to form the device can be reduced.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A device for analyzing at least one of a generated amount of positive charges, a generated amount of negative charges, and a generated amount of ultraviolet (UV) light, the device, comprising:
    a substrate on which at least one of a first device configured to detect a variation in threshold voltage relative to the generated amount of positive charges, a second device configured to detect a variation in threshold voltage relative to the generated amount of negative charges, and a third device configured to detect a variation in threshold voltage relative to the generated amount of UV light is formed,
    wherein each of the first device, the second device and the third device comprises:
    a first isolation region disposed in the substrate, wherein the first isolation region defines a first active region and a third active region each of a first conductivity type and a second active region and a fourth active region each of a second conductivity type different from the first conductivity type;
    first impurity regions disposed in the first active region and spaced apart from each other, and wherein the first impurity regions having the second conductivity type;
    a floating gate crossing over the first active region between the first impurity regions and extending over the second active region;
    a second impurity region disposed in the second active region and having the first conductivity type; and
    a conductive structure electrically connected to the second impurity region,
    wherein, in the first device, the second device and the third device, an overlap area between the second active region of the second conductive type and the floating gate is larger than an overlap area between the first active region of the first conductive type and the floating gate.

2. The device of claim 1, wherein each of the first device, the second device and the third device further comprises:
    a third impurity region disposed in the third active region and having the first conductivity type;
    a fourth impurity region disposed in the fourth active region and having the second conductivity type;
    a source terminal electrically connected to one of the first impurity regions;
    a drain terminal electrically connected to the other of the first impurity regions; and
    a well terminal electrically connected to the third impurity region,
    wherein, in the first device, the second device and the third device, at least a portion of the conductive structure is defined as a gate terminal.

3. The device of claim 2, wherein each of the first device and the third device further comprises a plug which electrically connects the conductive structure and the fourth impurity region.

4. The device of claim 3, wherein the first device is configured to accumulate positive charges, which are generated during a plasma process, through the second impurity region of the first device in the second active region, and wherein the first device is configured to emit negative charges, which are generated during the plasma process, through the fourth impurity region and the fourth active region, to the substrate.

5. The device of claim 2, wherein, in the second device, the well terminal is electrically connected not only to the third impurity region but also to the fourth impurity region.

6. The device of claim 5, wherein the second device is configured to emit positive charges, which are generated during a plasma process, through the second impurity region, the second active region and the fourth active region, the fourth impurity region, and the well terminal of the second device, and wherein the second device is configured to accumulate negative charges, which are generated during the plasma process, through the second impurity region in the second active region.

7. The device of claim 2, wherein, in the third device, the conductive structure has an opening exposing at least a portion of the floating gate.

8. The device of claim 7, wherein the opening has a smaller planar area than the floating gate.

9. The device of claim 7, wherein the opening overlaps the floating gate.

10. The device of claim 1, wherein, in the first device and the second device, a portion of the conductive structure is defined as a gate terminal, and a portion of the remaining portion of the conductive structure is defined as an antenna configured to introduce positive charges and negative charges into the first device and the second device.

11. The device of claim 1, wherein the first device is configured such that electrical properties of the floating gate of the first device are varied due to the accumulation of positive charges generated during a plasma process in the second active region,
    wherein the second device is configured such that the electrical properties of the floating gate of the second device are varied due to the accumulation of negative charges generated during the plasma process in the second active region, and
    wherein the third device is configured such that the electrical properties of the floating gate of the third device are varied by exciting electrons in the floating gate with UV light generated during the plasma process.

12. The device of claim 1, wherein the first active region and the third active region are disposed in a first well region of the first conductivity type of the substrate, and the second active region and the fourth active region are disposed in a second well region of the second conductivity type of the substrate.

13. The device of claim 1, wherein, in each of the first device and the second device, the conductive structure completely covers the floating gate when viewed in plan view.

14. A device for analyzing at least one of a generated amount of positive charges, a generated amount of negative charges, and a generated amount of ultraviolet (UV) light, the device, comprising:
    a substrate,
    a first isolation region disposed in the substrate, wherein the first isolation region defines a first active region and a third active region each of a first conductivity type and a second active region and a fourth active region each of a second conductivity type different from the first conductivity type;
    first impurity regions disposed in the first active region and spaced apart from each other, and wherein the first impurity regions having the second conductivity type;

a floating gate crossing over the first active region between the first impurity regions and extending over the second active region;

a second impurity region disposed in the second active region and having the first conductivity type; and a conductive structure electrically connected to the second impurity region, wherein the conductive structure completely covers the second active region when viewed in plan view.

15. The device of claim 1, wherein the conductive structure of each of the first device and the second device completely covers the second active region when viewed in plan view.

16. The device of claim 1, wherein the floating gate comprises a first floating gate crossing over the first active region and a second floating gate disposed on a portion of the second active region, wherein the first floating age and the second floating gate are electrically connected to each other, and wherein the second floating gate has a width greater than a width of the first floating gate.

17. The device of claim 14, wherein, the conductive structure completely covers the floating gate when viewed in plan view.

* * * * *